(12) United States Patent  
Li et al.

(10) Patent No.: US 12,408,273 B2  
(45) Date of Patent: Sep. 2, 2025

(54) ELECTRONIC DEVICE AND METHOD OF FABRICATING ELECTRONIC DEVICE

(71) Applicants: BEIJING BOE OPTOELECTRONICS TECHNOLOGY CO., LTD., Beijing (CN); BOE Technology Group Co., Ltd., Beijing (CN)

(72) Inventors: Huiying Li, Beijing (CN); Yue Li, Beijing (CN); Yuelei Xiao, Beijing (CN); Yulin Feng, Beijing (CN); Xue Cao, Beijing (CN); Qichang An, Beijing (CN); Yifan Wu, Beijing (CN); Biqi Li, Beijing (CN)

(73) Assignees: BEIJING BOE OPTOELECTRONICS TECHNOLOGY CO., LTD., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/264,093

(22) PCT Filed: Nov. 18, 2022

(86) PCT No.: PCT/CN2022/132815  
§ 371 (c)(1),  
(2) Date: Aug. 3, 2023

(87) PCT Pub. No.: WO2024/103381  
PCT Pub. Date: May 23, 2024

(65) Prior Publication Data  
US 2025/0016926 A1  Jan. 9, 2025

(51) Int. Cl.  
*H05K 3/30* (2006.01)  
*H05K 1/11* (2006.01)  
(Continued)

(52) U.S. Cl.  
CPC ............ *H05K 1/181* (2013.01); *H05K 1/115* (2013.01); *H05K 3/30* (2013.01); *H05K 3/4644* (2013.01)

(58) Field of Classification Search  
CPC .......... H05K 1/181; H05K 1/115; H05K 3/30; H05K 3/4644  
See application file for complete search history.

(56) References Cited

U.S. PATENT DOCUMENTS

2003/0218254 A1  11/2003  Kurimoto et al.  
2005/0087878 A1   4/2005  Uesugi et al.  
(Continued)

FOREIGN PATENT DOCUMENTS

CN  1407620 A    4/2003  
CN  111128933 A  5/2020  
(Continued)

OTHER PUBLICATIONS

International Search Report & Written Opinion mailed Apr. 23, 2023, regarding PCT/CN2022/132815.

*Primary Examiner* — Sherman Ng  
(74) *Attorney, Agent, or Firm* — Intellectual Valley Law, P.C.

(57) ABSTRACT

An electronic device is provided. The electronic device includes electric components in an effective area; and a retaining structure substantially surrounding a boundary of the effective area. The electronic device includes a base substrate, and multiple conductive layer and multiple insulating layers alternately stacked on the base substrate. The retaining structure is configured to enhance adhesion between conductive layers adjacent to each other in the electronic device. The retaining structure includes one or more retaining layers. A respective retaining layer of the one (Continued)

or more retaining layers is in direct contact with at least one insulating layer of the electronic device.

17 Claims, 26 Drawing Sheets

(51) Int. Cl.
*H05K 1/18* (2006.01)
*H05K 3/46* (2006.01)

(56) References Cited

U.S. PATENT DOCUMENTS

| | | |
|---|---|---|
| 2008/0093746 A1* | 4/2008 | Lee .................. H01L 23/53238 |
| | | 257/776 |
| 2009/0315184 A1 | 12/2009 | Tokitoh |
| 2014/0264767 A1 | 9/2014 | Gratz et al. |
| 2017/0062355 A1 | 3/2017 | Liang et al. |
| 2020/0135664 A1 | 4/2020 | Tseng et al. |
| 2021/0098392 A1* | 4/2021 | Wu ....................... H10F 39/024 |
| 2021/0125910 A1* | 4/2021 | Shih ................... H01L 25/0657 |
| 2021/0280481 A1 | 9/2021 | He |
| 2021/0305178 A1 | 9/2021 | West |

FOREIGN PATENT DOCUMENTS

| | | |
|---|---|---|
| CN | 111480226 A | 7/2020 |
| EP | 3002786 A1 | 4/2016 |

* cited by examiner

ELECTRONIC DEVICE AND METHOD OF FABRICATING ELECTRONIC DEVICE

CROSS-REFERENCE TO RELATED APPLICATION

This application is a national stage application under 35 U.S.C. § 371 of International Application No. PCT/CN2022/132815, filed Nov. 18, 2022, the contents of which are incorporated by reference in the entirety.

TECHNICAL FIELD

The present invention relates to electronics, more particularly, to an electronic device and a method of fabricating an electronic device.

BACKGROUND

An integrated passive device (IPD) is a passive electrical component that contains one or more passive electrical circuit element(s), such as an inductor, capacitor, resistor, coils/chokes, microstrip-lines, impedance matching elements, baluns, or some series and parallel combination of these elements. The elements are integrated in the same package or on the same substrate.

SUMMARY

In one aspect, the present disclosure provides an electronic device, comprising electric components in an effective area; and a retaining structure substantially surrounding a boundary of the effective area; wherein the electronic device comprises a base substrate, and multiple conductive layer and multiple insulating layers alternately stacked on the base substrate; the retaining structure is configured to enhance adhesion between conductive layers adjacent to each other in the electronic device; the retaining structure comprises one or more retaining layers; and a respective retaining layer of the one or more retaining layers is in direct contact with at least one insulating layer of the electronic device.

Optionally, the retaining structure is between the boundary of the effective area and an edge of the electronic device.

Optionally, the respective retaining layer comprises a respective ring substantially surrounding the effective area of the electronic device.

Optionally, the respective ring is a continuous ring substantially surrounding the effective area of the electronic device.

Optionally, the respective ring is a discontinuous ring substantially surrounding the effective area of the electronic device, the discontinuous ring comprising a plurality of segments.

Optionally, at least two adjacent retaining layers of the one or more retaining layers are connected through a via in an insulating layer between the two adjacent retaining layers.

Optionally, the one or more retaining layers comprises a first respective retaining layer and a second respective retaining layer on a side of the first respective retaining layer away from a base substrate; wherein the retaining structure further comprises a first connecting structure connecting the first respective retaining layer with the second respective retaining layer; the second respective retaining layer and the first connecting structure are parts of a first unitary structure; the first respective retaining layer is in a same layer as a first conductive layer in the effective area of the electronic device; and the second respective retaining layer is in a same layer as a second conductive layer in the effective area of the electronic device.

Optionally, the one or more retaining layers further comprises a third respective retaining layer on a side of the second respective retaining layer away from the base substrate; wherein the retaining structure further comprises a second connecting structure connecting the second respective retaining layer with the third respective retaining layer; the third respective retaining layer and the second connecting structure are parts of a second unitary structure; and the third respective retaining layer is in a same layer as a third conductive layer in the effective area of the electronic device.

Optionally, the one or more retaining layers comprises a first respective retaining layer, a second respective retaining layer on a side of the first respective retaining layer away from a base substrate, and a third respective retaining layer on a side of the second respective retaining layer away from the base substrate; wherein the retaining structure further comprises a connecting structure connecting the third respective retaining layer with the second respective retaining layer; the third respective retaining layer and the connecting structure are parts of a unitary structure; the first respective retaining layer is in a same layer as a first conductive layer in the effective area of the electronic device; the second respective retaining layer is in a same layer as a second conductive layer in the effective area of the electronic device; and the third respective retaining layer is in a same layer as a third conductive layer in the effective area of the electronic device.

Optionally, the one or more retaining layers comprises a first respective retaining layer, a second respective retaining layer on a side of the first respective retaining layer away from a base substrate, and a third respective retaining layer on a side of the second respective retaining layer away from the base substrate; wherein the retaining structure further comprises a connecting structure connecting the first respective retaining layer with the second respective retaining layer; the second respective retaining layer and the connecting structure are parts of a unitary structure; the first respective retaining layer is in a same layer as a first conductive layer in the effective area of the electronic device; the second respective retaining layer is in a same layer as a second conductive layer in the effective area of the electronic device; and the third respective retaining layer is in a same layer as a third conductive layer in the effective area of the electronic device.

Optionally, the one or more retaining layers comprises a first respective retaining layer and a second respective retaining layer on a side of the first respective retaining layer away from a base substrate; wherein the retaining structure further comprises a connecting structure connecting the first respective retaining layer with the second respective retaining layer; the second respective retaining layer and the connecting structure are parts of a first unitary structure; the first respective retaining layer is in a same layer as a first conductive layer in the effective area of the electronic device; and the second respective retaining layer is in a same layer as a third conductive layer in the effective area of the electronic device; wherein the electronic device further comprises a second conductive layer in the effective area, the second conductive layer on a side of the first conductive layer closer to the third conductive layer; the electronic device further comprises a first insulating layer spacing apart the first conductive layer and the second conductive layer, and a second insulating layer spacing apart the second conductive layer and the third conductive layer; and the connecting structure extends through a via extending through the first insulating layer and the second insulating layer.

Optionally, the electronic device further comprises one or more auxiliary retaining layers; wherein a respective auxiliary retaining layer of the one or more auxiliary retaining layers is in direct contact with at least one retaining layer of the one or more retaining layers.

Optionally, the respective auxiliary retaining layer comprises a material different from a material in the at least one retaining layer.

Optionally, the electronic device comprises a first respective auxiliary retaining layer; a first respective retaining layer on a side of the first respective auxiliary retaining layer away from a base substrate; a second respective auxiliary retaining layer on a side of the first respective retaining layer away from the base substrate; a second respective retaining layer on a side of the second respective auxiliary retaining layer away from the base substrate; and a first connecting structure connecting the first respective retaining layer with the second respective retaining layer; wherein the first connecting structure comprises at least a portion of the second respective auxiliary retaining layer and a portion connected with the second respective retaining layer; the second respective retaining layer and the portion of the first connecting structure connected with the second respective retaining layer are parts of a unitary structure; the first respective retaining layer is in a same layer as a first conductive layer in the effective area of the electronic device; and the second respective retaining layer is in a same layer as a second conductive layer in the effective area of the electronic device.

Optionally, the electronic device further comprises a third respective auxiliary retaining layer on a side of the second respective retaining layer away from the base substrate; a third respective retaining layer on a side of the third respective auxiliary retaining layer away from the base substrate; and a second connecting structure connecting the second respective retaining layer with the third respective retaining layer; wherein the second connecting structure comprises at least a portion of the third respective auxiliary retaining layer and a portion connected with the third respective retaining layer; the third respective retaining layer and the portion of the second connecting structure connected with the third respective retaining layer are parts of a second unitary structure; and the third respective retaining layer is in a same layer as a third conductive layer in the effective area of the electronic device.

Optionally, the electronic device comprises a first respective auxiliary retaining layer; a first respective retaining layer on a side of the first respective auxiliary retaining layer away from a base substrate; a second respective retaining layer on a side of the first respective retaining layer away from the base substrate; a second respective auxiliary retaining layer on a side of the second respective retaining layer away from the base substrate; a third respective retaining layer on a side of the second respective auxiliary retaining layer away from the base substrate; and a connecting structure connecting the third respective retaining layer with the second respective retaining layer; wherein the connecting structure comprises at least a portion of the second respective auxiliary retaining layer and a portion connected with the third respective retaining layer; the third respective retaining layer and the portion of the connecting structure connected with the third respective retaining layer are parts of a unitary structure; the first respective retaining layer is in a same layer as a first conductive layer in the effective area of the electronic device; the second respective retaining layer is in a same layer as a second conductive layer in the effective area of the electronic device; and the third respective retaining layer is in a same layer as a third conductive layer in the effective area of the electronic device.

Optionally, the electronic device comprises a first respective auxiliary retaining layer; a first respective retaining layer on a side of the first respective auxiliary retaining layer away from a base substrate; a second respective auxiliary retaining layer on a side of the first respective retaining layer away from the base substrate; a second respective retaining layer on a side of the second respective auxiliary retaining layer away from the base substrate; a third respective retaining layer on a side of the second respective retaining layer away from the base substrate; and a connecting structure connecting the first respective retaining layer with the second respective retaining layer; wherein the connecting structure includes at least a portion of the second respective auxiliary retaining layer and a portion connected with the second respective retaining layer; the second respective retaining layer and the portion of the connecting structure connected with the second respective retaining layer are parts of a unitary structure; the first respective retaining layer is in a same layer as a first conductive layer in the effective area of the electronic device; the second respective retaining layer is in a same layer as a second conductive layer in the effective area of the electronic device; and the third respective retaining layer is in a same layer as a third conductive layer in the effective area of the electronic device.

Optionally, the electronic device comprises a first respective auxiliary retaining layer; a first respective retaining layer on a side of the first respective auxiliary retaining layer away from a base substrate; a second respective auxiliary retaining layer on a side of the first respective retaining layer away from the base substrate; a second respective retaining layer on a side of the second respective auxiliary retaining layer away from the base substrate; and a connecting structure connecting the first respective retaining layer with the second respective retaining layer; wherein the connecting structure comprises at least a portion of the second respective auxiliary retaining layer and a portion connected with the second respective retaining layer; the second respective retaining layer and the portion of the connecting structure connected with the second respective retaining layer are parts of a unitary structure; the first respective retaining layer is in a same layer as a first conductive layer in the effective area of the electronic device; and the second respective retaining layer is in a same layer as a third conductive layer in the effective area of the electronic device; wherein the electronic device further comprises a second conductive layer in the effective area, the second conductive layer on a side of the first conductive layer closer to the third conductive layer; the electronic device further comprises a first insulating layer spacing apart the first conductive layer and the second conductive layer, and a second insulating layer spacing apart the second conductive layer and the third conductive layer; and the connecting structure extends through a via extending through the first insulating layer and the second insulating layer.

In another aspect, the present disclosure provides a method of fabricating an electronic device, comprising forming electric components in an effective area; and forming a retaining structure substantially surrounding a boundary of the effective area; wherein the method comprises forming multiple conductive layer and multiple insulating layers alternately stacked on a base substrate; the retaining structure is configured to enhance adhesion between conductive layers adjacent to each other in the electronic device; forming the retaining structure comprises forming one or more retaining layers; and a respective retaining layer of the one or more retaining layers is in direct contact with at least one insulating layer of the electronic device.

Optionally, the method further comprises providing a mother substrate comprising a plurality of retaining structures and a plurality of effective areas, a respective retaining structure substantially surrounding a boundary of a respective effective area of the plurality of effective areas; and cutting the mother substrate along one or more cutting lines to produce the electronic device; wherein an individual cutting line of the one or more cutting lines is on a side of the respective retaining structure away from the boundary.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Typically, electrical components in an integrated passive device are formed using a stacked structure comprising at least one conductive layer and at least one insulating layer. Optionally, the conductive layer includes a metallic element such as copper. Optionally, the insulating layer includes a polymeric material such as a photosensitive polyimide.

Metallic materials and insulating materials in the stacked structure of the integrated passive device have different thermal stress, e.g., stress produced by a change in the temperature of the materials. For example, copper has a thermal expansion coefficient of 17.5 ppm/degree Celsius, a photosensitive polyimide on the other hand may have a thermal expansion coefficient of 50-60 ppm/degree Celsius. Due to the large difference between the thermal expansion coefficients, the conductive material and the insulating material have different thermal expansion under a same temperature change. In one example, the thermal expansion of copper is only about 1/3 of the thermal expansion of the photosensitive polyimide material, leading to tensile stress on the insulating layer in the integrated passive device. Because the adhesion between the conductive layers is limited in related integrated passive device, the tensile stress often results in peeling of the layers in the integrated passive device.

The inventors of the present disclosure discover that there is an additional cause for peeling of layers in the integrated passive device. In a fabrication process, a mother substrate is cut to produce multiple number of integrated passive devices. Due to the stacked structure in the mother substrate, the insulating layer (typically having a thickness less than 10 µm) is subject to cutting stress, and is prone to be chipped by the cutting wheel. Subsequently, the crack in the insulating layer frequently propagates from the cutting region into other regions of the integrated passive device, resulting in peeling in other regions.

Figure 1:
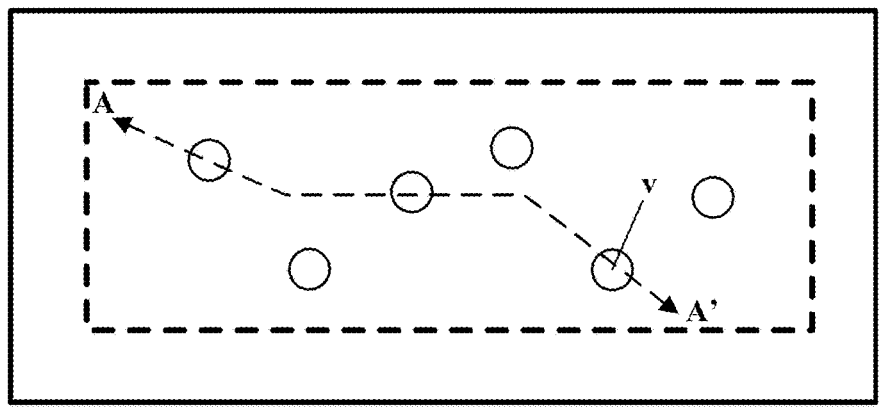
FIG. 1 is a plan view of a related integrated passive device.
Figure 2:
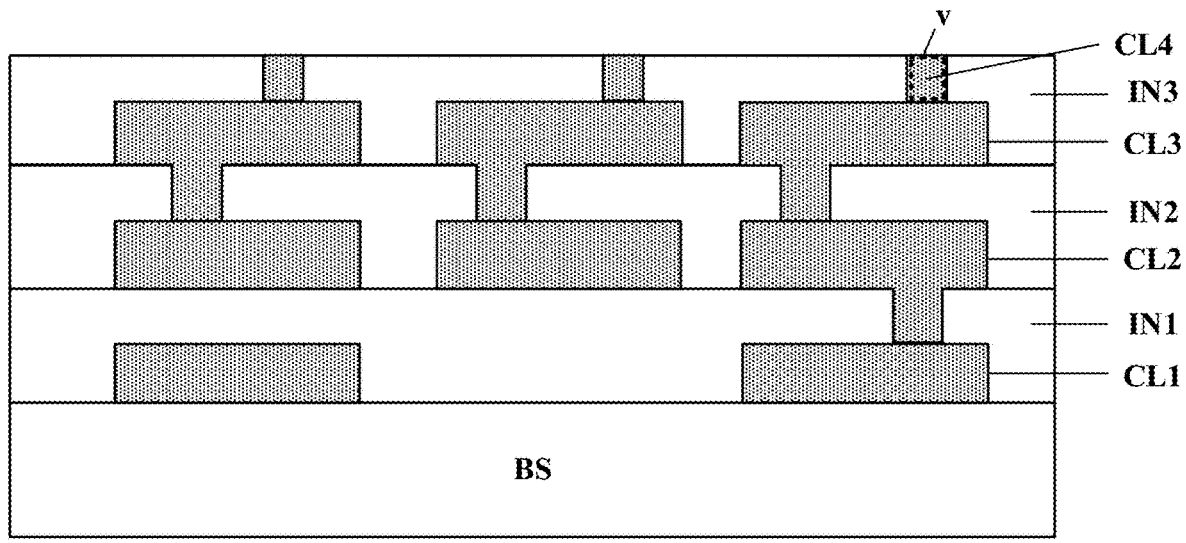
FIG. 2 is a cross-sectional view along an A-A' line in FIG. 1.

FIG. 1 is a plan view of a related integrated passive device. FIG. 2 is a cross-sectional view along an A-A' line in FIG. 1. Referring to FIG. 1 and FIG. 2, the related integrated passive device in some embodiments includes a base substrate BS, and multiple conductive layer and multiple insulating layers alternately stacked on the base substrate BS. In one example, the related integrated passive device includes a first conductive layer CL1 on the base substrate BS, a first insulating layer IN1 on a side of the first conductive layer CL1 away from the base substrate BS, a second conductive layer CL2 on a side of the first insulating layer IN1 away from the base substrate BS, a second insulating layer IN2 on a side of the second conductive layer CL2 away from the base substrate BS, a third conductive layer CL3 on a side of the second insulating layer IN2 away from the base substrate BS, a third insulating layer IN3 on a side of the third conductive layer CL3 away from the base substrate BS, and a fourth conductive layer CL4 on a side of the third insulating layer IN3 away from the base substrate BS. The related integrated passive device includes a plurality of vias v. FIG. 1 and FIG. 2 depict a respective via of the plurality of vias v. The respective via extends through the third insulating layer IN3, the fourth conductive layer CL4 connects to the third conductive layer CL3 through the respective via.

Figure 3:
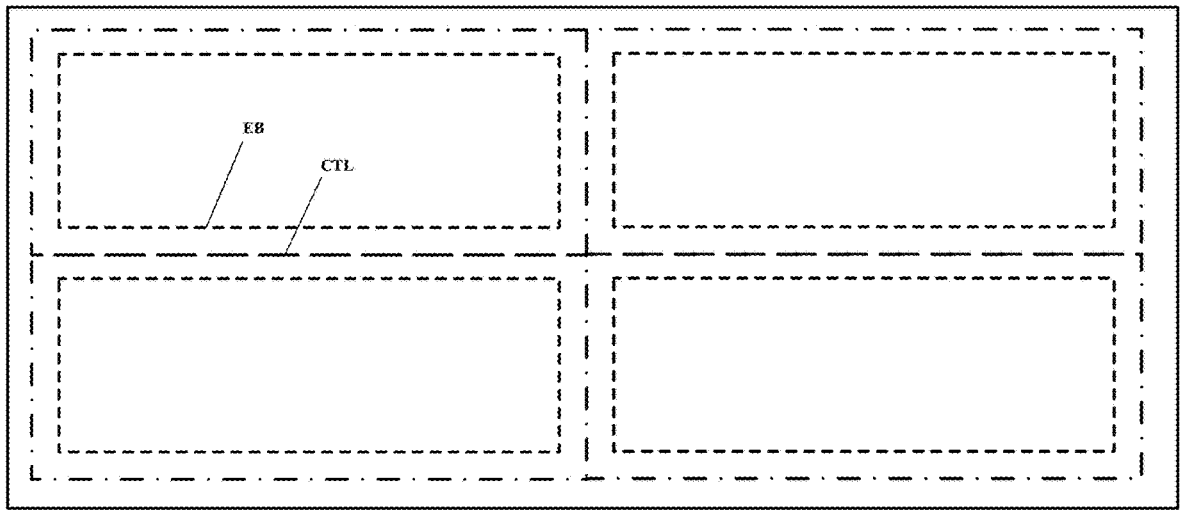
FIG. 3 illustrate a process of cutting a mother substrate to form a plurality of integrated passive devices.

FIG. 3 illustrate a process of cutting a mother substrate to form a plurality of integrated passive devices. Referring to FIG. 3, the mother substrate is cut along a cutting line CTL to form a plurality of integrated passive devices. A boundary EB of an effective area of a respective integrated passive device is also denoted in FIG. 3. As shown in FIG. 3, the cutting line CTL is distanced apart from the boundary EB of the effective area. As discussed above, adjacent conductive layers of the respective integrated passive device are connected through the plurality of vias. Effective connection areas are relatively small. The connection areas (corresponding to the plurality of vias) are distributed irregularly in the effective area. Thus, the layers in the respective integrated passive device are prone to peeling during or subsequent to the cutting process.

Accordingly, the present disclosure provides, inter alia, an electronic device and a method of fabricating an electronic device that substantially obviate one or more of the problems due to limitations and disadvantages of the related art. In one aspect, the present disclosure provides an electronic device. In some embodiments, the electronic device includes electric components in an effective area; and a retaining structure substantially surrounding a boundary of the effective area. Optionally, the electronic device comprises a base substrate, and multiple conductive layer and multiple insulating layers alternately stacked on the base substrate. Optionally, the retaining structure is configured to enhance adhesion between conductive layers adjacent to each other in the electronic device. Optionally, the retaining structure comprises a plurality of retaining layers. Optionally, a respective retaining layer of the plurality of retaining layers is in direct contact with at least one insulating layer of the electronic device.

Figure 4:
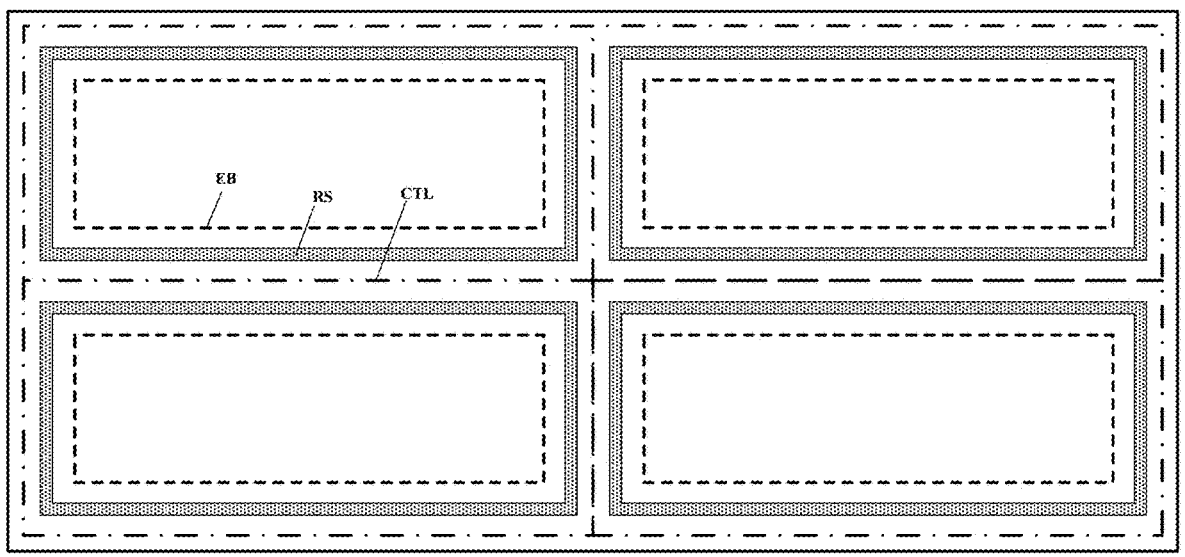
FIG. 4 illustrate a process of cutting a mother substrate to form a plurality of electronic devices in some embodiments according to the present disclosure.

FIG. 4 illustrate a process of cutting a mother substrate to form a plurality of electronic devices in some embodiments according to the present disclosure. Referring to FIG. 4, the mother substrate in some embodiments includes a retaining structure RS substantially surrounding a boundary EB of an effective area of the electronic device. As used herein the term "substantially surrounding" refers to surrounding at least 30% (e.g., at least 40%, at least 50%, at least 60%, at least 70%, at least 80%, at least 90%, at least 95%, at least 99%, and 100%) of a perimeter of an area. As used herein, the term "effective area" refers to an area having electric components for effectively performing an intended function of an electronic device. The retaining structure RS is between the boundary EB of the effective area and a cutting line CTL along which the mother substrate is cut. Optionally, an orthographic projection of the retaining structure RS on a base substrate is spaced apart from an orthographic projection of the effective area EA on the base substrate. Optionally, an orthographic projection of the cutting line CTL on the base substrate is spaced apart from the orthographic projection of the retaining structure RS on the base substrate.

Figure 5:
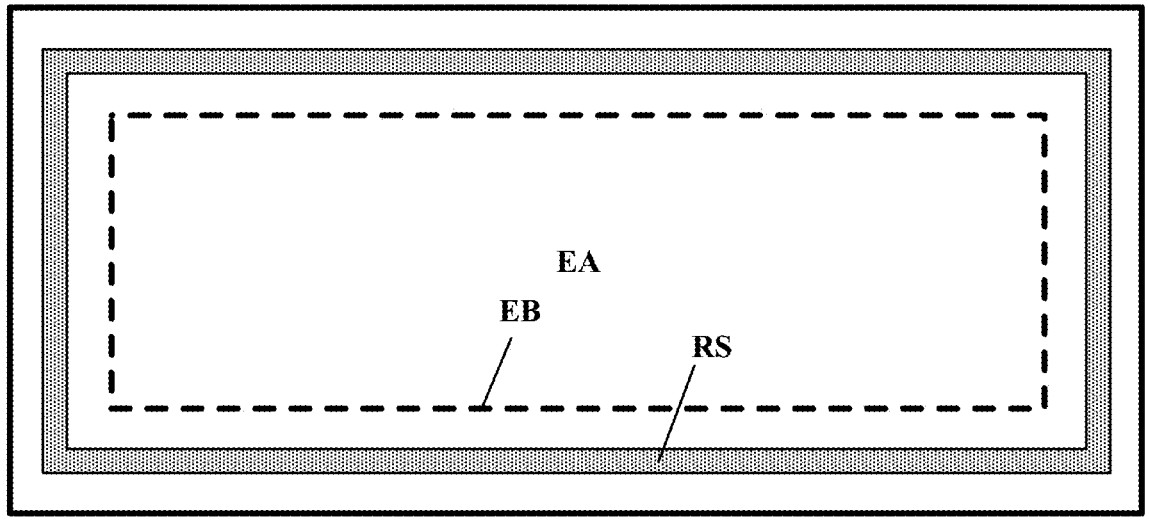
FIG. 5 is a plan view of an electronic device in some embodiments according to the present disclosure.

FIG. 5 is a plan view of an electronic device in some embodiments according to the present disclosure. Referring to FIG. 5, the electronic device in some embodiments includes one or more electric components in an effective area EA surrounded by a boundary EB; and a retaining structure RS substantially surrounding the boundary EB. Optionally, an orthographic projection of the retaining structure RS on a base substrate is spaced apart from an orthographic projection of the effective area EA on the base substrate. The retaining structure is configured to enhance adhesion between adjacent layers of the electronic device, e.g., adhesion between conductive layers adjacent to each other in the electronic device.

In some embodiments, all of the electric components configured to perform the intended functions of the electronic device is in the effective area EA. Optionally, an orthographic projection of the retaining structure RS on a base substrate substantially surrounds an orthographic projection of all of the electric components of the electronic device on the base substrate.

Figure 6:
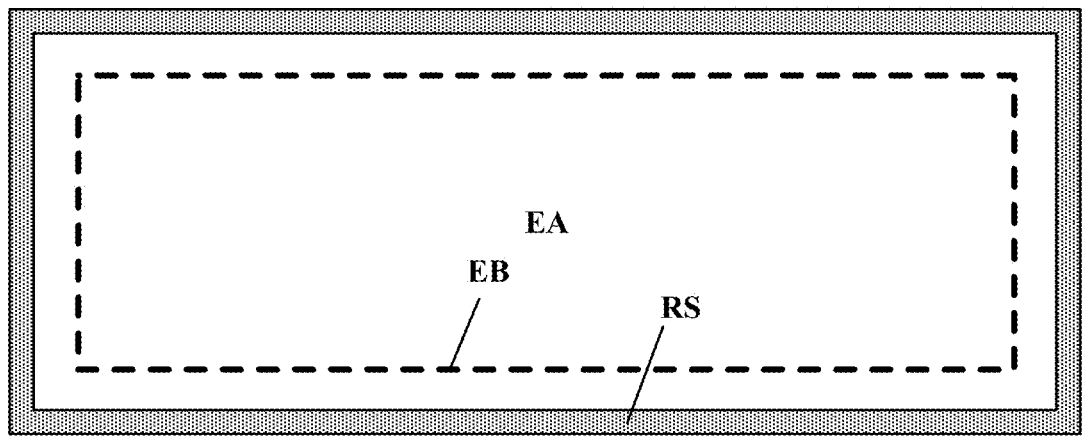
FIG. 6 is a plan view of an electronic device in some embodiments according to the present disclosure.

FIG. 6 is a plan view of an electronic device in some embodiments according to the present disclosure. Referring to FIG. 6, subsequent to the cutting process, a peripheral portion of the retaining structure RS is at least partially exposed, for example, a lateral side of the retaining structure RS is at least partially exposed.

Referring to FIG. 5, a lateral side of the retaining structure RS is unexposed.

Figure 7:
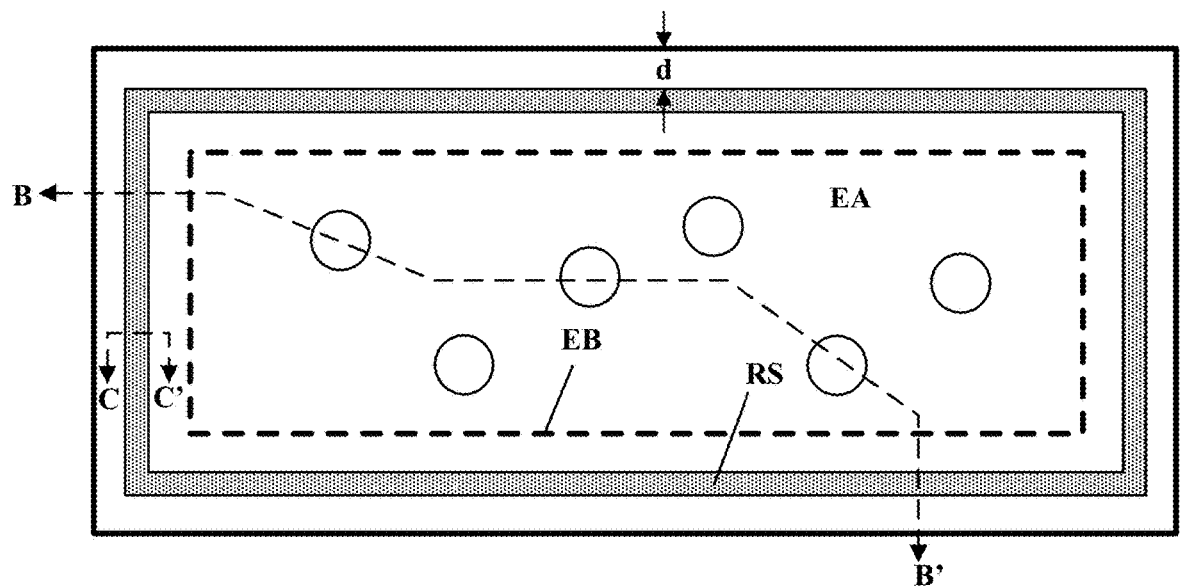
FIG. 7 is a plan view of an electronic device in some embodiments according to the present disclosure.
Figure 8:
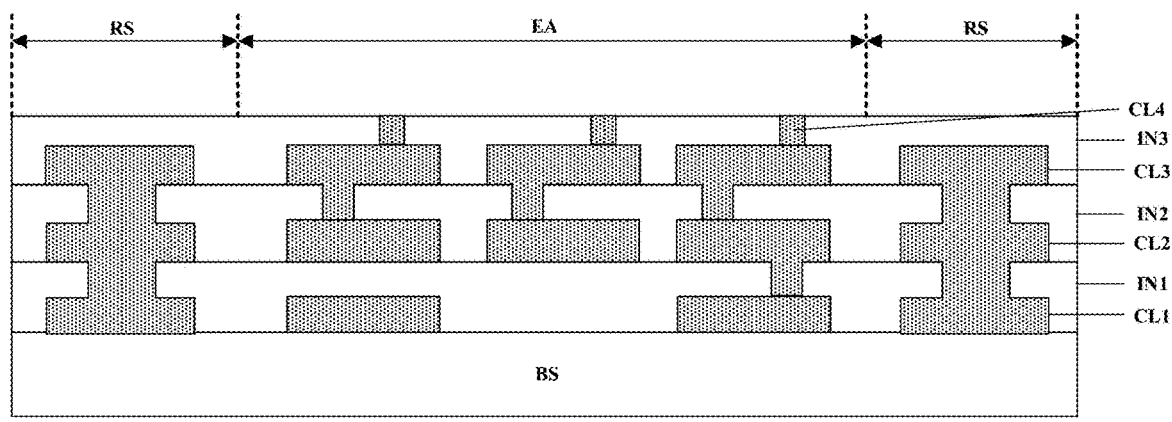
FIG. 8 is a cross-sectional view along a B-B' line in FIG. 7.

FIG. 7 is a plan view of an electronic device in some embodiments according to the present disclosure. FIG. 8 is a cross-sectional view along a B-B' line in FIG. 7. Referring to FIG. 7 and FIG. 8, the electronic device in some embodiments includes a base substrate BS, and multiple conductive layer and multiple insulating layers alternately stacked on the base substrate BS. In one example, the electronic device includes a first conductive layer CL1 on the base substrate BS, a first insulating layer IN1 on a side of the first conductive layer CL1 away from the base substrate BS, a second conductive layer CL2 on a side of the first insulating layer IN1 away from the base substrate BS, a second insulating layer IN2 on a side of the second conductive layer CL2 away from the base substrate BS, a third conductive layer CL3 on a side of the second insulating layer IN2 away from the base substrate BS, a third insulating layer IN3 on a side of the third conductive layer CL3 away from the base substrate BS, and a fourth conductive layer CL4 on a side of the third insulating layer IN3 away from the base substrate BS. The electronic device includes a retaining structure RS outside the effective area.

Referring to FIG. 8, the retaining structure in some embodiments includes a plurality of retaining layers spaced apart by an insulating layer (e.g., the first insulating layer IN1, the second insulating layer IN2, or the third insulating layer IN3 depicted in FIG. 8). A respective retaining layer of the plurality of retaining layers includes a retaining material.

Various appropriate retaining materials may be used for making the retaining structure. In one example, the retaining material is an insulating material. In another example, the retaining material is a conductive material. In another example, the retaining material is a semiconductive material.

Examples of insulating materials suitable for making the retaining structure include silicon oxide (SiOy), silicon nitride (SiNy, e.g., Si3N4), and silicon oxynitride (SiOxNy), polyesters, polycarbonates. When the retaining structure includes an insulating material, the insulating material is one different from the insulating layer spacing apart the plurality of retaining layers. For example, the first insulating layer IN1, the second insulating layer IN2, or the third insulating layer IN3 depicted in FIG. 8 may include polyimide, whereas the retaining structure includes polycarbonate.

In some embodiments, the retaining material includes a conductive material. Optionally, the retaining material includes a same conductive material as a conductive material of an electric component in the effective area. Optionally, the retaining material includes a same metallic material as a metallic material of an electric component in the effective area. Examples of appropriate metallic material for making the retaining structure include copper, titanium, tantalum, aluminum, molybdenum, chromium, and various alloys or laminates thereof. Examples of appropriate non-metallic conductive material for making the retaining structure include carbon nano tube, graphene, and conductive polymers.

Examples of semiconductive materials suitable for making the retaining structure include polysilicon, metal oxides such as indium tin oxide.

Figure 9:
FIG. 9 is a plan view of a respective retaining layer in some embodiments according to the present disclosure.
Figure 10:
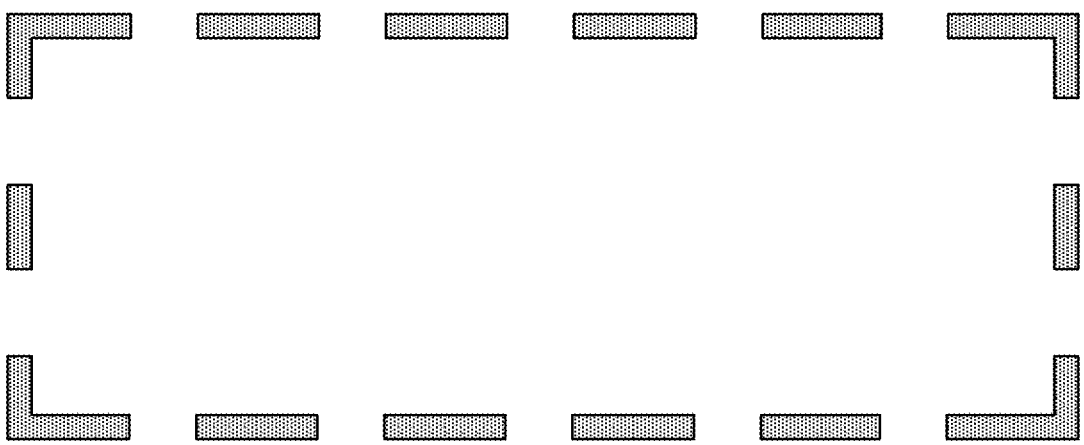
FIG. 10 is a plan view of a respective retaining layer in some embodiments according to the present disclosure.
Figure 11:
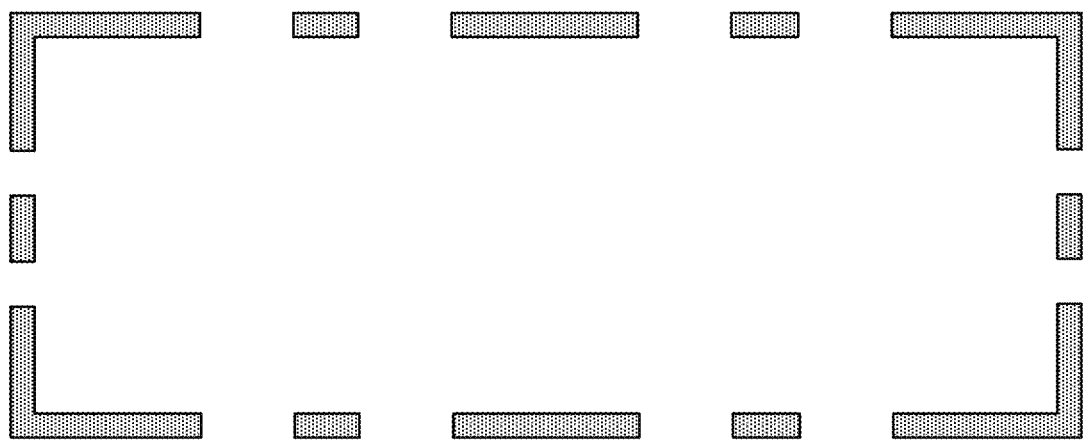
FIG. 11 is a plan view of a respective retaining layer in some embodiments according to the present disclosure.

FIG. 9 is a plan view of a respective retaining layer in some embodiments according to the present disclosure. FIG. 10 is a plan view of a respective retaining layer in some embodiments according to the present disclosure. FIG. 11 is a plan view of a respective retaining layer in some embodiments according to the present disclosure. Referring to FIG. 9 to FIG. 11, the respective retaining structure in some embodiments includes a respective retaining ring substantially surrounding the effective area of the electronic device. As used herein, the term "ring" or "ring structure" refers to a structure or portion of a structure having a hole there through, including but not limited to a ring or doughnut shape. A ring structure may be essentially round like a doughnut, or may be formed of a square, triangle or another shape with a hole there through. As used herein, a ring structure does not require that the ring shape be unbroken, and the term is intended to encompass structures that are substantially closed, but that comprise a break or a gap in the ring shape.

Referring to FIG. 9, the respective retaining layer in some embodiments includes a continuous ring substantially surrounding the effective area of the electronic device. The respective retaining layer extends continuously around the effective area of the electronic device, forming a closed ring.

Referring to FIG. 10 and FIG. 11, the respective retaining layer in some embodiments includes a discontinuous ring comprising a plurality of segments. The plurality of segments together substantially surround the effective area of the electronic device. In FIG. 10, at least two segments of the plurality of segments have a same length, for example, all segments of the plurality of segments have a same length. In FIG. 11, at least two segments of the plurality of segments have different lengths. Various alternative implementations may be practiced in the present disclosure.

When the respective retaining layer is a continuous ring, an enhanced inter-layer adhesion (e.g., adhesion between adjacent respective retaining layers) may be achieved. When the respective retaining layer is a discontinuous ring, tensile stress between the respective retaining layer and an adjacent insulating layer may be reduced.

Figure 12:
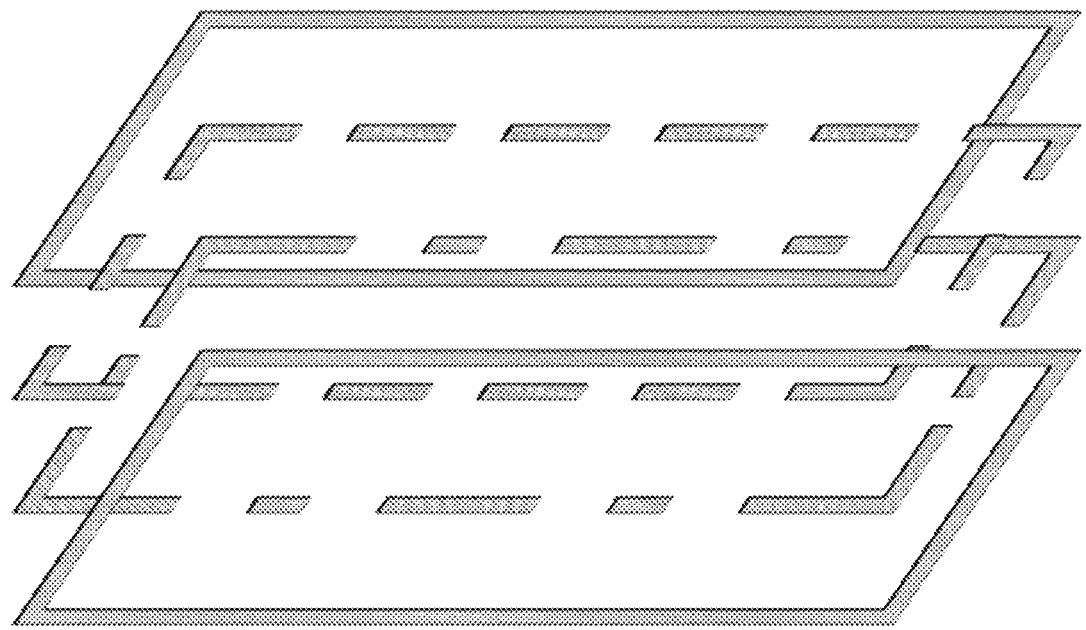
FIG. 12 is a perspective view of a plurality of retaining layers in some embodiments according to the present disclosure.

The plurality of retaining layers may be all continuous rings, may be all discontinuous rings, or may include at least one continuous ring and at least one discontinuous ring. FIG. 12 is a perspective view of a plurality of retaining layers in some embodiments according to the present disclosure. Referring to FIG. 12, the plurality of retaining layers in some embodiments include both continuous ring(s) and discontinuous ring(s). At least two adjacent retaining layers of the plurality of retaining layers may be connected through a via in an insulating layer in-between. The inter-layer connection is omitted in FIG. 12, but will be discussed in detail below.

Figure 13:
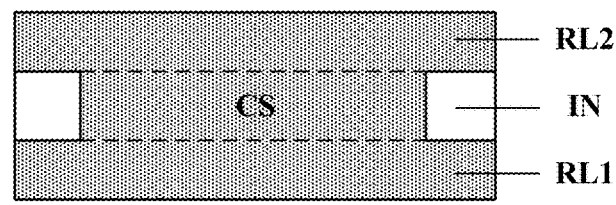
FIG. 13 illustrates inter-layer connection between two adjacent retaining layers in some embodiments according to the present disclosure.

FIG. 13 illustrates inter-layer connection between two adjacent retaining layers in some embodiments according to the present disclosure. Referring to FIG. 13, the plurality of retaining layers in some embodiments include a first respective retaining layer RL1 and a second respective retaining layer RL2 spaced apart by an insulating layer IN. The retaining structure further includes a connecting structure CS (e.g., a single connecting block per one segment of the plurality of segments of a retaining layer) connecting the first respective retaining layer RL1 with the second respective retaining layer RL2. The single connecting block extends through a via in the insulating layer IN. As shown in FIG. 13, a segment of the first respective retaining layer RL1 and a segment of the second respective retaining layer RL2 are connected by the single connecting block. In one example, a length of the single connecting block along the extension direction of the first respective retaining layer RL1 and the second respective retaining layer RL2 is at least 50% (e.g., at least 60%, at least 70%, at least 80%, at least 90%, at least 95%, at least 99%, or 100%) of a length of the segment of the first respective retaining layer RL1 or the segment of the second respective retaining layer RL2. In the retaining structure depicted in FIG. 13, an enhanced inter-layer adhesion (e.g., adhesion between adjacent respective retaining layers) may be achieved.

Figure 14:
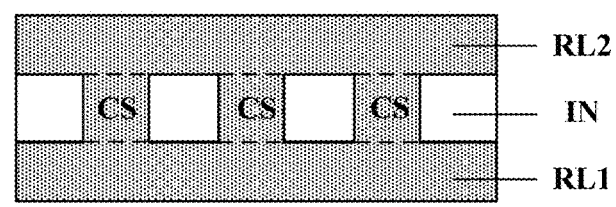
FIG. 14 illustrates inter-layer connection between two adjacent retaining layers in some embodiments according to the present disclosure.

FIG. 14 illustrates inter-layer connection between two adjacent retaining layers in some embodiments according to the present disclosure. Referring to FIG. 14, the plurality of retaining layers in some embodiments include a first respective retaining layer RL1 and a second respective retaining layer RL2 spaced apart by an insulating layer IN. The retaining structure further includes a connecting structure CS, which comprises a plurality of connecting blocks (e.g., per one segment of the plurality of segments of a retaining layer) respectively connecting the first respective retaining layer RL1 with the second respective retaining layer RL2. A respective connecting block of the plurality of connecting blocks extends through a via in the insulating layer IN. As shown in FIG. 14, a segment of the first respective retaining layer RL1 and a segment of the second respective retaining layer RL2 are connected by the plurality of connecting blocks. In one example, a length of a respective connecting block along the extension direction of the first respective retaining layer RL1 and the second respective retaining layer RL2 is less than 50% (e.g., less than 40%, less than 30%, less than 20%, less than 10%, or less than 5%) of a length of the segment of the first respective retaining layer RL1 or the segment of the second respective retaining layer RL2. In the retaining structure depicted in FIG. 14, tensile stress between the respective retaining layer and an adjacent insulating layer may be reduced as compared to the retaining structure depicted in FIG. 13.

Figure 15:
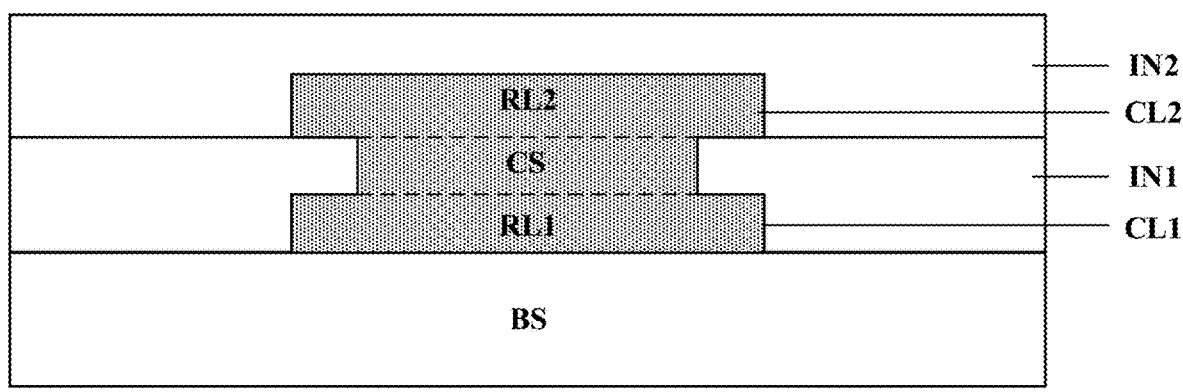
FIG. 15 is a cross-sectional view of a retaining structure in some embodiments according to the present disclosure.

FIG. 15 is a cross-sectional view of a retaining structure in some embodiments according to the present disclosure. For example, FIG. 15 may depict a cross-section along a C-C' line in FIG. 7. Referring to FIG. 15, a total number of the plurality of retaining layers may be two. The plurality of retaining layers in some embodiments include a first respective retaining layer RL1 and a second respective retaining layer RL2 spaced apart by a first insulating layer IN1. The retaining structure further includes a connecting structure CS connecting the first respective retaining layer RL1 with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. As used herein, the term "same layer" refers to the relationship between the layers simultaneously formed in the same step. In one example, the first respective retaining layer RL1 and the first conductive layer CL1 are in a same layer when they are formed as a result of one or more steps of a same patterning process performed in a material deposited in a same deposition process. In another example, the first respective retaining layer RL1 and the first conductive layer CL1 can be formed in a same layer by simultaneously performing the step of forming the first respective retaining layer RL1 and the step of forming the first conductive layer CL1. The term "same layer" does not always mean that the thickness of the layer or the height of the layer in a cross-sectional view is the same. In one example, the second respective retaining layer RL2 and the connecting structure CS are parts of a unitary structure. In another example, the first respective retaining layer RL1, the second respective retaining layer RL2, and the connecting structure CS are parts of a unitary structure.

Figure 16:
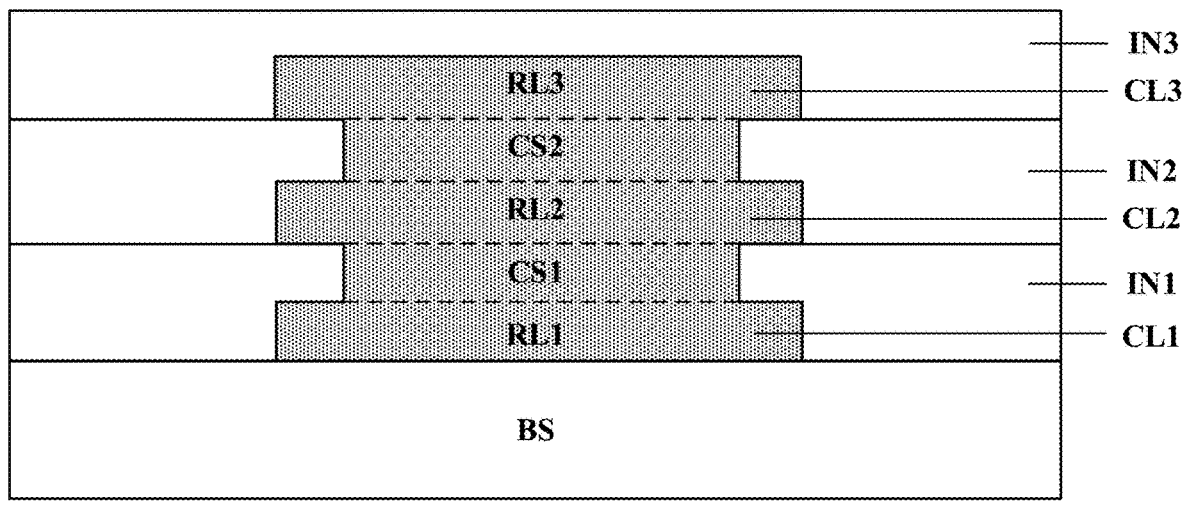
FIG. 16 is a cross-sectional view of a retaining structure in some embodiments according to the present disclosure.

FIG. 16 is a cross-sectional view of a retaining structure in some embodiments according to the present disclosure. For example, FIG. 16 may depict a cross-section along a C-C' line in FIG. 7. Referring to FIG. 16, a total number of the plurality of retaining layers may be three. The plurality of retaining layers in some embodiments include a first respective retaining layer RL1, a second respective retaining layer RL2, and a third respective retaining layer RL3. The first respective retaining layer RL1 and the second respective retaining layer RL2 are spaced apart by a first insulating layer IN1. The second respective retaining layer RL2 and the third respective retaining layer RL3 are spaced apart by a second insulating layer IN2. The retaining structure further includes a first connecting structure CS1 connecting the first respective retaining layer RL1 with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. The retaining structure further includes a second connecting structure CS2 connecting the second respective retaining layer RL2 with the third respective retaining layer RL3. Optionally, the third respective retaining layer RL3 is in a same layer as the third conductive layer CL3 in the effective area of the electronic device. In one example, the second respective retaining layer RL2 and the first connecting structure CS1 are parts of a unitary structure. In another example, the third respective retaining layer RL3 and the second connecting structure CS2 are parts of a unitary structure.

Figure 17:
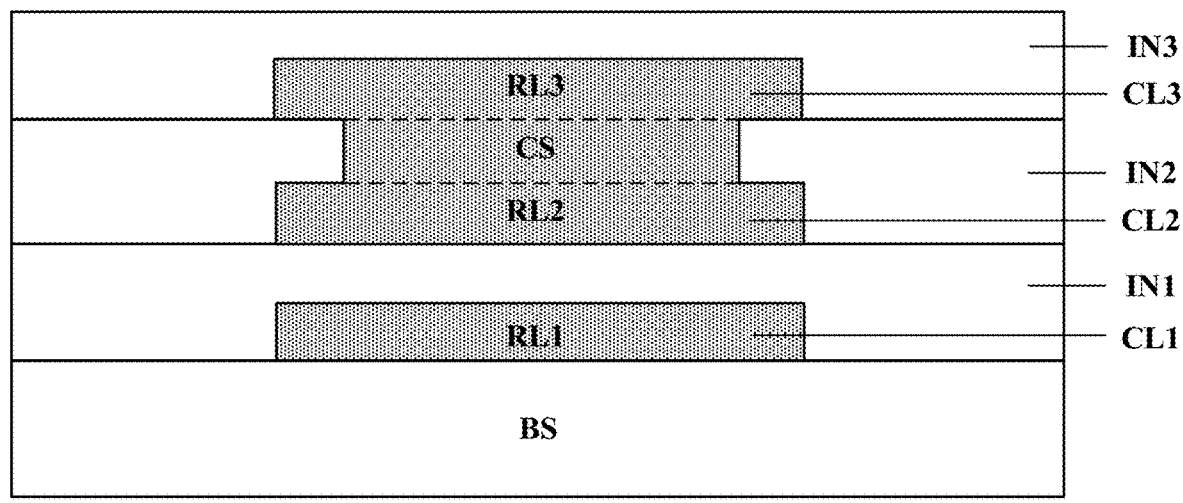
FIG. 17 is a cross-sectional view of a retaining structure in some embodiments according to the present disclosure.

FIG. 17 is a cross-sectional view of a retaining structure in some embodiments according to the present disclosure. For example, FIG. 17 may depict a cross-section along a C-C' line in FIG. 7. Referring to FIG. 17, a total number of the plurality of retaining layers may be three. The plurality of retaining layers in some embodiments include a first respective retaining layer RL1, a second respective retaining layer RL2, and a third respective retaining layer RL3. The first respective retaining layer RL1 and the second respective retaining layer RL2 are spaced apart by a first insulating layer IN1. The second respective retaining layer RL2 and the third respective retaining layer RL3 are spaced apart by a second insulating layer IN2. The retaining structure further includes a connecting structure CS connecting the second respective retaining layer RL2 with the third respective retaining layer RL3. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. Optionally, the third respective retaining layer RL3 is in a same layer as the third conductive layer CL3 in the effective area of the electronic device. In one example, the third respective retaining layer RL3 and the connecting structure CS are parts of a unitary structure.

Figure 18:
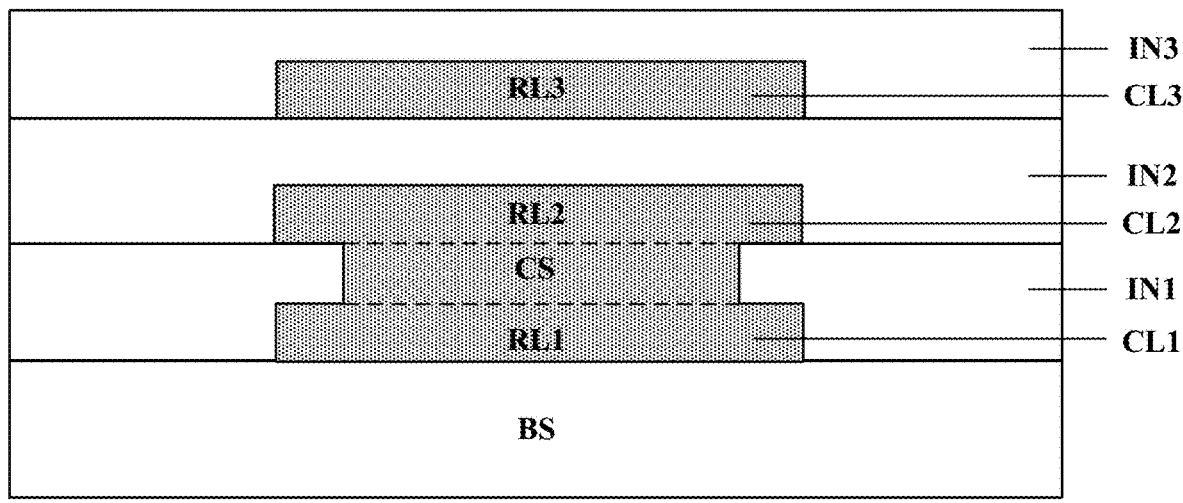
FIG. 18 is a cross-sectional view of a retaining structure in some embodiments according to the present disclosure.

FIG. 18 is a cross-sectional view of a retaining structure in some embodiments according to the present disclosure. For example, FIG. 18 may depict a cross-section along a C-C' line in FIG. 7. Referring to FIG. 18, a total number of the plurality of retaining layers may be three. The plurality of retaining layers in some embodiments include a first respective retaining layer RL1, a second respective retaining layer RL2, and a third respective retaining layer RL3. The first respective retaining layer RL1 and the second respective retaining layer RL2 are spaced apart by a first insulating layer IN1. The second respective retaining layer RL2 and the third respective retaining layer RL3 are spaced apart by a second insulating layer IN2. The retaining structure further includes a connecting structure CS connecting the first respective retaining layer RL1 with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. Optionally, the third respective retaining layer RL3 is in a same layer as the third conductive layer CL3 in the effective area of the electronic device. In one example, the second respective retaining layer RL2 and the connecting structure CS are parts of a unitary structure.

Figure 19:
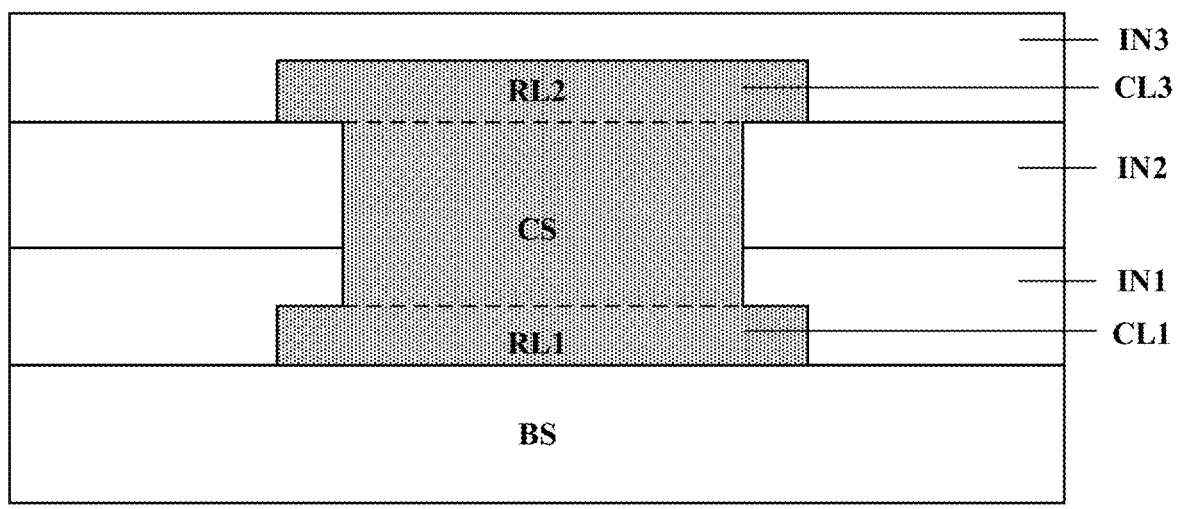
FIG. 19 is a cross-sectional view of a retaining structure in some embodiments according to the present disclosure.

FIG. 19 is a cross-sectional view of a retaining structure in some embodiments according to the present disclosure. For example, FIG. 19 may depict a cross-section along a C-C' line in FIG. 7. Referring to FIG. 19, a total number of the plurality of retaining layers may be two. The plurality of retaining layers in some embodiments include a first respective retaining layer RL1 and a second respective retaining layer RL2 spaced apart by a first insulating layer IN1 and a second insulating layer IN2. The retaining structure further includes a connecting structure CS connecting the first respective retaining layer RL1 with the second respective retaining layer RL2. Optionally, the first respective retaining layer RL1 is in a same layer as the first conductive layer CL1 in the effective area of the electronic device. Optionally, the second respective retaining layer RL2 is in a same layer as the third conductive layer CL3 in the effective area of the electronic device. In one example, the second respective retaining layer RL2 and the connecting structure CS are parts of a unitary structure.

Figure 20:
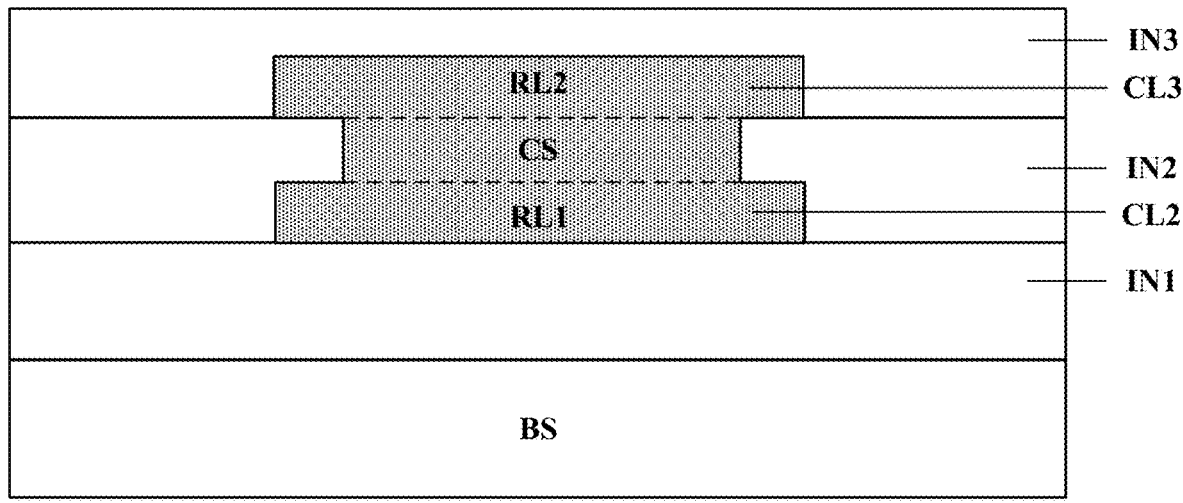
FIG. 20 is a cross-sectional view of a retaining structure in some embodiments according to the present disclosure.
Figure 21:
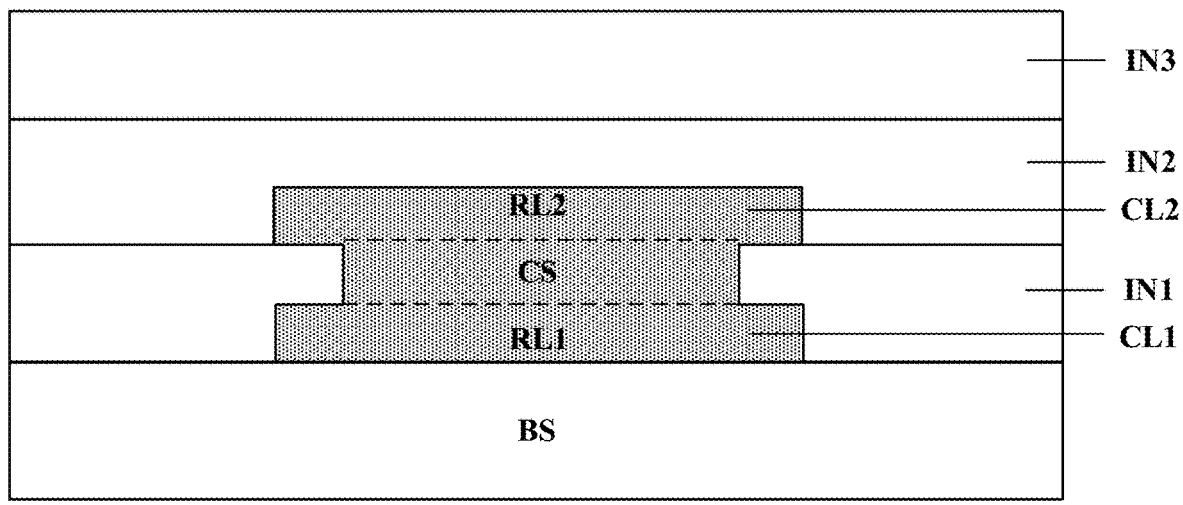
FIG. 21 is a cross-sectional view of a retaining structure in some embodiments according to the present disclosure.

FIG. 20 is a cross-sectional view of a retaining structure in some embodiments according to the present disclosure. For example, FIG. 20 may depict a cross-section along a C-C' line in FIG. 7. Referring to FIG. 21, a total number of the plurality of retaining layers may be two. The plurality of retaining layers in some embodiments include a first respective retaining layer RL1 and a second respective retaining layer RL2 spaced apart by a second insulating layer IN2. The retaining structure further includes a connecting structure CS connecting the first respective retaining layer RL1 with the second respective retaining layer RL2. Optionally, the first respective retaining layer RL1 is in a same layer as the second conductive layer CL2 in the effective area of the electronic device. Optionally, the second respective retaining layer RL2 is in a same layer as the third conductive layer CL3 in the effective area of the electronic device. In one example, the second respective retaining layer RL2 and the connecting structure CS are parts of a unitary structure.

FIG. 21 is a cross-sectional view of a retaining structure in some embodiments according to the present disclosure. For example, FIG. 21 may depict a cross-section along a C-C' line in FIG. 7. Referring to FIG. 21, a total number of the plurality of retaining layers may be two. The plurality of retaining layers in some embodiments include a first respective retaining layer RL1 and a second respective retaining layer RL2 spaced apart by a first insulating layer IN1. The retaining structure further includes a connecting structure CS connecting the first respective retaining layer RL1 with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. In one example, the second respective retaining layer RL2 and the connecting structure CS are parts of a unitary structure.

In some embodiments, referring to FIG. 7, the retaining structure RS is spaced apart from an outer edge (resulting from the cutting process) of the electronic device by a distance d. In one example, d>0. The distance d may be varied depending on various factors, e.g., the size of the electronic device.

In some embodiments, the retaining structure further includes one or more auxiliary retaining layers. A respective auxiliary retaining layer of the one or more auxiliary retaining layers is in direct contact with at least one retaining layer of the plurality of retaining layers. In one example, the respective auxiliary retaining layer includes a same material as the at least one retaining layer. In another example, the respective auxiliary retaining layer includes a material different from a material in the at least one retaining layer.

Figure 22:
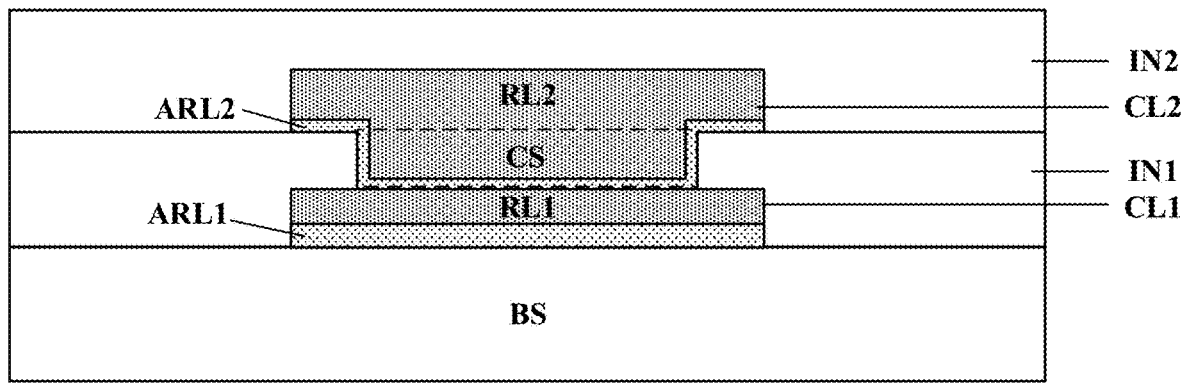
FIG. 22 is a cross-sectional view of a retaining structure in some embodiments according to the present disclosure.

FIG. 22 is a cross-sectional view of a retaining structure in some embodiments according to the present disclosure. For example, FIG. 22 may depict a cross-section along a C-C' line in FIG. 7. Referring to FIG. 22, a total number of the plurality of retaining layers may be two, and a total number of the plurality of auxiliary retaining layers may be two. The retaining structure in some embodiments include a first respective auxiliary retaining layer ARL1, a first respective retaining layer RL1 on a side of the first respective auxiliary retaining layer ARL1 away from the base substrate BS, a second respective auxiliary retaining layer ARL2 on a side of the first respective retaining layer RL1 away from the base substrate BS, and a second respective retaining layer RL2 on a side of the second respective auxiliary retaining layer ARL2 away from the base substrate BS. The retaining structure includes a connecting structure CS connecting the first respective retaining layer RL1 with the second respective retaining layer RL2. Optionally, the connecting structure CS includes at least a portion of the second respective auxiliary retaining layer ARL2 and a portion connected with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. Optionally, the second respective retaining layer RL2 and the portion of the connecting structure CS connected with the second respective retaining layer RL2 are parts of a unitary structure.

Figure 23:
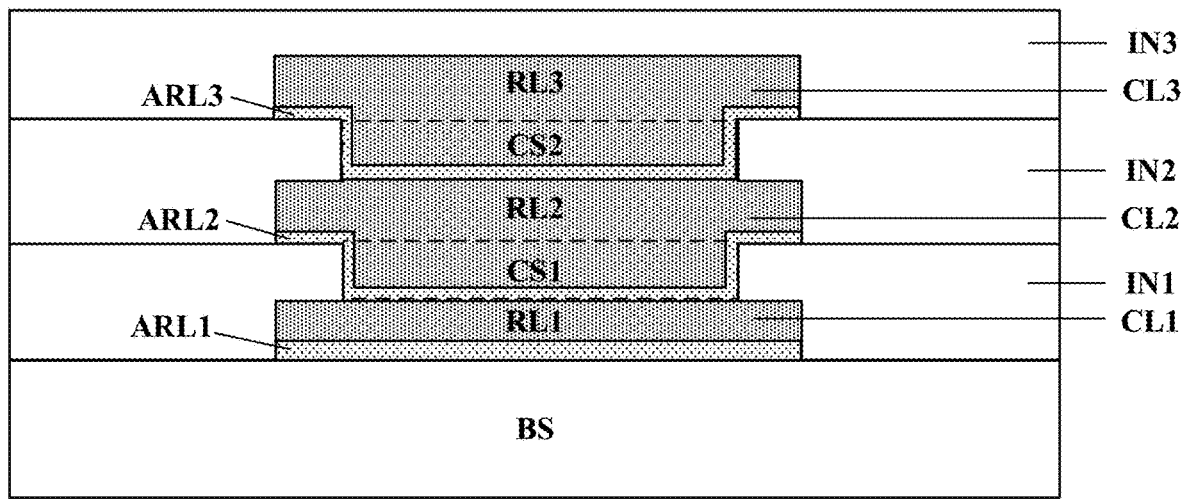
FIG. 23 is a cross-sectional view of a retaining structure in some embodiments according to the present disclosure.

FIG. 23 is a cross-sectional view of a retaining structure in some embodiments according to the present disclosure. For example, FIG. 23 may depict a cross-section along a C-C' line in FIG. 7. Referring to FIG. 23, a total number of the plurality of retaining layers may be three, and a total number of the plurality of auxiliary retaining layers may be three. The retaining structure in some embodiments include a first respective auxiliary retaining layer ARL1, a first respective retaining layer RL1 on a side of the first respective auxiliary retaining layer ARL1 away from the base substrate BS, a second respective auxiliary retaining layer ARL2 on a side of the first respective retaining layer RL1 away from the base substrate BS, a second respective retaining layer RL2 on a side of the second respective auxiliary retaining layer ARL2 away from the base substrate BS, a third respective auxiliary retaining layer ARL3 on a side of the second respective retaining layer RL2 away from the base substrate BS, and a third respective retaining layer RL3 on a side of the third respective auxiliary retaining layer ARL3 away from the base substrate BS. The retaining structure further includes a first connecting structure CS1 connecting the first respective retaining layer RL1 with the second respective retaining layer RL2. Optionally, the first connecting structure CS1 includes at least a portion of the second respective auxiliary retaining layer ARL2 and a portion connected with the second respective retaining layer RL2. The retaining structure further includes a second connecting structure CS2 connecting the second respective retaining layer RL2 with the third respective retaining layer RL3. Optionally, the second connecting structure CS2 includes at least a portion of the third respective auxiliary retaining layer ARL3 and a portion connected with the third respective retaining layer RL3. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. Optionally, the third respective retaining layer RL3 is in a same layer as the third conductive layer CL3 in the effective area of the electronic device. Optionally, the second respective retaining layer RL2 and the portion of the first connecting structure CS1 connected with the second respective retaining layer RL2 are parts of a first unitary structure. Optionally, the third respective retaining layer RL3 and the portion of the second connecting structure CS2 connected with the third respective retaining layer RL3 are parts of a second unitary structure.

Figure 24:
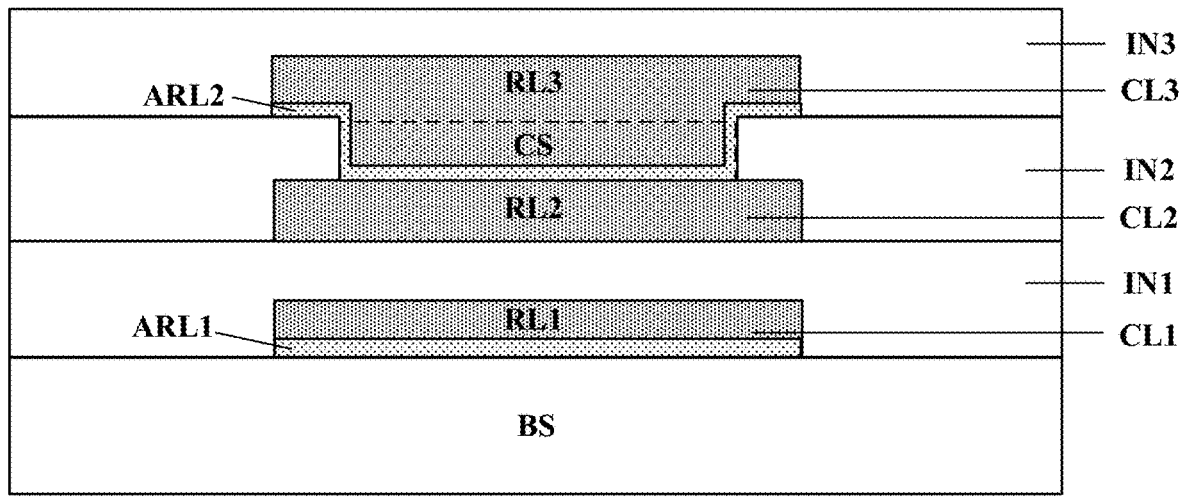
FIG. 24 is a cross-sectional view of a retaining structure in some embodiments according to the present disclosure.

FIG. 24 is a cross-sectional view of a retaining structure in some embodiments according to the present disclosure. For example, FIG. 24 may depict a cross-section along a C-C' line in FIG. 7. Referring to FIG. 24, a total number of the plurality of retaining layers may be three, and a total number of the plurality of auxiliary retaining layers may be two. The retaining structure in some embodiments include a first respective auxiliary retaining layer ARL1, a first respective retaining layer RL1 on a side of the first respective auxiliary retaining layer ARL1 away from the base substrate BS, a second respective retaining layer RL2 on a side of the first respective retaining layer RL1 away from the base substrate BS, a second respective auxiliary retaining layer ARL2 on a side of the second respective retaining layer RL2 away from the base substrate BS, and a third respective retaining layer RL3 on a side of the second respective auxiliary retaining layer ARL2 away from the base substrate BS. The retaining structure further includes a connecting structure CS connecting the second respective retaining layer RL3 with the third respective retaining layer RL3. Optionally, the connecting structure CS includes at least a portion of the second respective auxiliary retaining layer ARL2 and a portion connected with the third respective retaining layer RL3. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. Optionally, the third respective retaining layer RL3 is in a same layer as the third conductive layer CL3 in the effective area of the electronic device. Optionally, the third respective retaining layer RL3 and the portion of the connecting structure CS connected with the third respective retaining layer RL3 are parts of a unitary structure.

Figure 25:
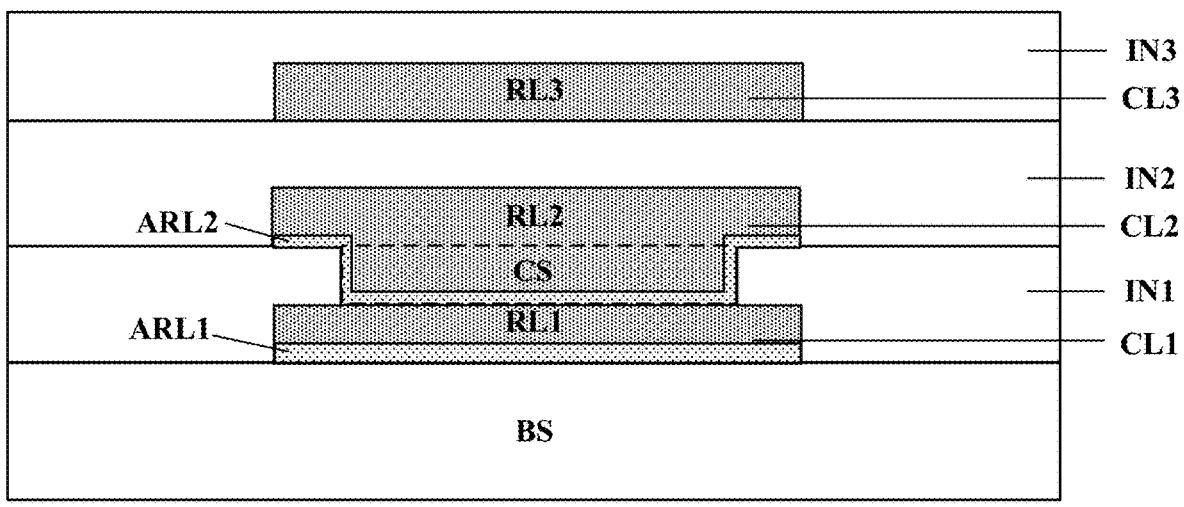
FIG. 25 is a cross-sectional view of a retaining structure in some embodiments according to the present disclosure.

FIG. 25 is a cross-sectional view of a retaining structure in some embodiments according to the present disclosure. For example, FIG. 25 may depict a cross-section along a C-C' line in FIG. 7. Referring to FIG. 25, a total number of the plurality of retaining layers may be three, and a total number of the plurality of auxiliary retaining layers may be two. The retaining structure in some embodiments include a first respective auxiliary retaining layer ARL1, a first respective retaining layer RL1 on a side of the first respective auxiliary retaining layer ARL1 away from the base substrate BS, a second respective auxiliary retaining layer ARL2 on a side of the first respective retaining layer RL1 away from the base substrate BS, a second respective retaining layer RL2 on a side of the second respective auxiliary retaining layer ARL2 away from the base substrate BS, and a third respective retaining layer RL3 on a side of the second respective retaining layer RL2 away from the base substrate BS. The retaining structure further includes a connecting structure CS connecting the first respective retaining layer RL1 with the second respective retaining layer RL2. Optionally, the connecting structure CS includes at least a portion of the second respective auxiliary retaining layer ARL2 and a portion connected with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. Optionally, the third respective retaining layer RL3 is in a same layer as the third conductive layer CL3 in the effective area of the electronic device. Optionally, the second respective retaining layer RL2 and the portion of the connecting structure CS connected with the second respective retaining layer RL2 are parts of a unitary structure.

Figure 26:
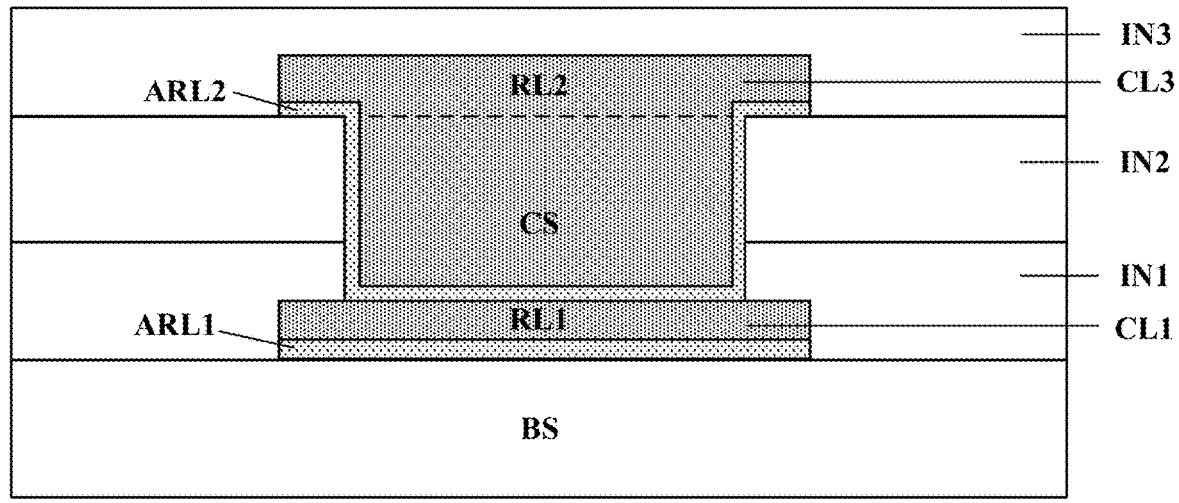
FIG. 26 is a cross-sectional view of a retaining structure in some embodiments according to the present disclosure.

FIG. 26 is a cross-sectional view of a retaining structure in some embodiments according to the present disclosure. For example, FIG. 26 may depict a cross-section along a C-C' line in FIG. 7. Referring to FIG. 26, a total number of the plurality of retaining layers may be two, and a total number of the plurality of auxiliary retaining layers may be two. The retaining structure in some embodiments include a first respective auxiliary retaining layer ARL1, a first respective retaining layer RL1 on a side of the first respective auxiliary retaining layer ARL1 away from the base substrate BS, a second respective auxiliary retaining layer ARL2 on a side of the first respective retaining layer RL1 away from the base substrate BS, and a second respective retaining layer RL2 on a side of the second respective auxiliary retaining layer ARL2 away from the base substrate BS. The retaining structure further includes a connecting structure CS connecting the first respective retaining layer RL1 with the second respective retaining layer RL2. Optionally, the connecting structure CS includes at least a portion of the second respective auxiliary retaining layer ARL2 and a portion connected with the second respective retaining layer RL2. Optionally, the first respective retaining layer RL1 is in a same layer as the first conductive layer CL1 in the effective area of the electronic device. Optionally, the second respective retaining layer RL2 is in a same layer as the third conductive layer CL3 in the effective area of the electronic device. Optionally, the second respective retaining layer RL2 and the portion of the connecting structure CS connected with the second respective retaining layer RL2 are parts of a unitary structure.

Figure 27:
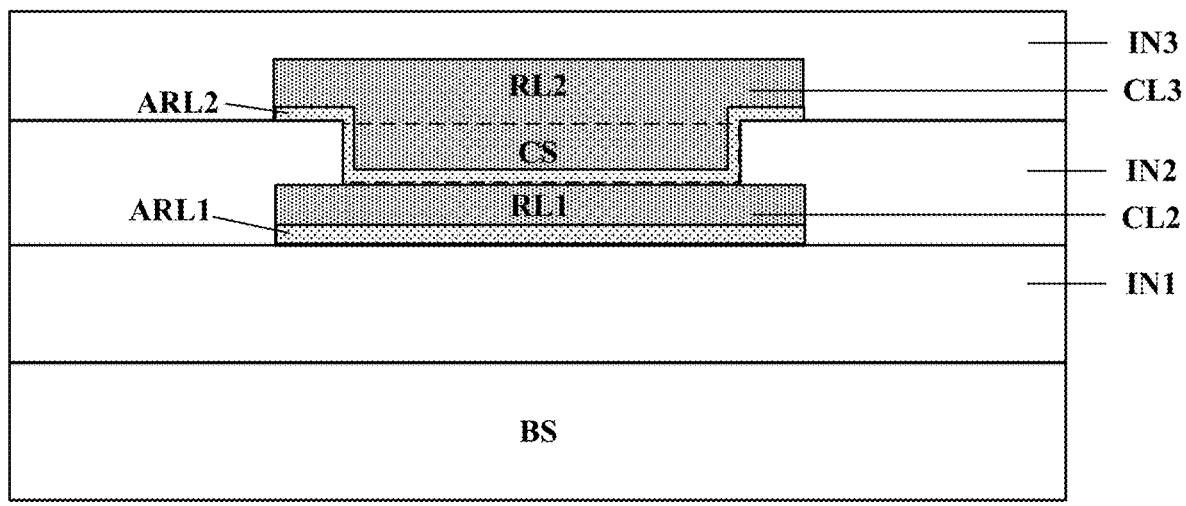
FIG. 27 is a cross-sectional view of a retaining structure in some embodiments according to the present disclosure.

FIG. 27 is a cross-sectional view of a retaining structure in some embodiments according to the present disclosure. For example, FIG. 27 may depict a cross-section along a C-C' line in FIG. 7. Referring to FIG. 27, a total number of the plurality of retaining layers may be two, and a total number of the plurality of auxiliary retaining layers may be two. The retaining structure in some embodiments include a first respective auxiliary retaining layer ARL1, a first respective retaining layer RL1 on a side of the first respective auxiliary retaining layer ARL1 away from the base substrate BS, a second respective auxiliary retaining layer ARL2 on a side of the first respective retaining layer RL1 away from the base substrate BS, and a second respective retaining layer RL2 on a side of the second respective auxiliary retaining layer ARL2 away from the base substrate BS. The retaining structure further includes a connecting structure CS connecting the first respective retaining layer RL1 with the second respective retaining layer RL2. Optionally, the connecting structure CS includes at least a portion of the second respective auxiliary retaining layer ARL2 and a portion connected with the second respective retaining layer RL2. Optionally, the first respective retaining layer RL1 is in a same layer as the second conductive layer CL2 in the effective area of the electronic device. Optionally, the second respective retaining layer RL2 is in a same layer as the third conductive layer CL3 in the effective area of the electronic device. Optionally, the second respective retaining layer RL2 and the portion of the connecting structure CS connected with the second respective retaining layer RL2 are parts of a unitary structure.

Figure 28:
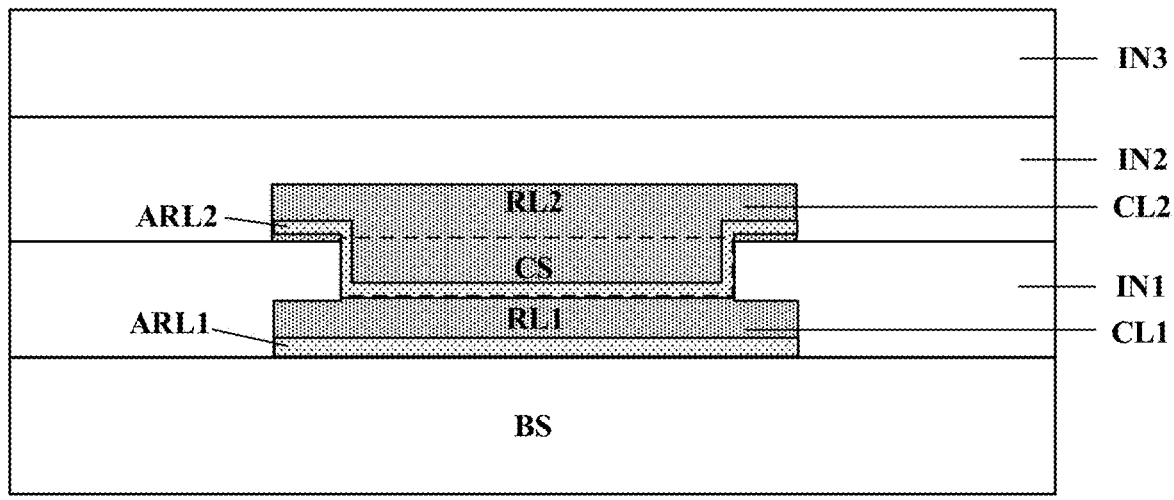
FIG. 28 is a cross-sectional view of a retaining structure in some embodiments according to the present disclosure.

FIG. 28 is a cross-sectional view of a retaining structure in some embodiments according to the present disclosure. For example, FIG. 28 may depict a cross-section along a C-C' line in FIG. 7. Referring to FIG. 28, a total number of the plurality of retaining layers may be two, and a total number of the plurality of auxiliary retaining layers may be two. The retaining structure in some embodiments include a first respective auxiliary retaining layer ARL1, a first respective retaining layer RL1 on a side of the first respective auxiliary retaining layer ARL1 away from the base substrate BS, a second respective auxiliary retaining layer ARL2 on a side of the first respective retaining layer RL1 away from the base substrate BS, and a second respective retaining layer RL2 on a side of the second respective auxiliary retaining layer ARL2 away from the base substrate BS. The retaining structure further includes a connecting structure CS connecting the first respective retaining layer RL1 with the second respective retaining layer RL2. Optionally, the connecting structure CS includes at least a portion of the second respective auxiliary retaining layer ARL2 and a portion connected with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. Optionally, the second respective retaining layer RL2 and the portion of the connecting structure CS connected with the second respective retaining layer RL2 are parts of a unitary structure.

Figure 29:
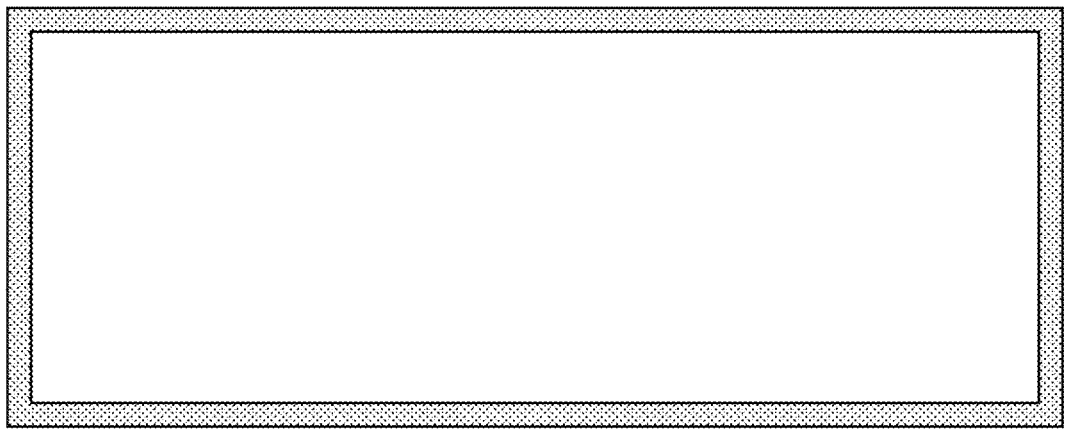
FIG. 29 is a plan view of a respective auxiliary retaining layer in some embodiments according to the present disclosure.
Figure 30:
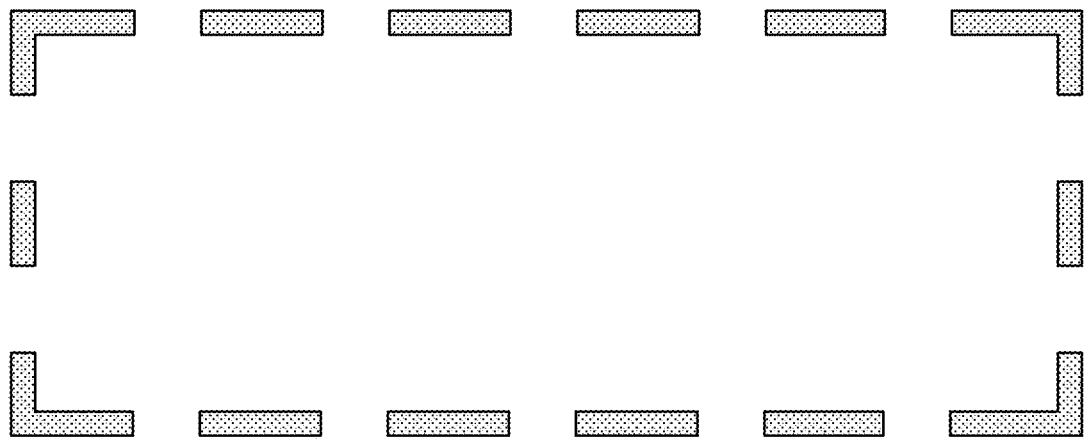
FIG. 30 is a plan view of a respective auxiliary retaining layer in some embodiments according to the present disclosure.
Figure 31:
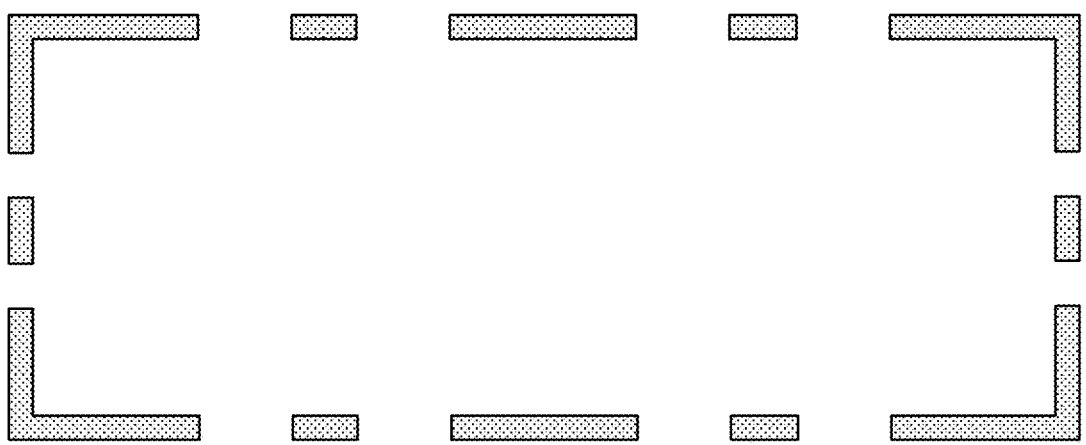
FIG. 31 is a plan view of a respective auxiliary retaining layer in some embodiments according to the present disclosure.

FIG. 29 is a plan view of a respective auxiliary retaining layer in some embodiments according to the present disclosure. FIG. 30 is a plan view of a respective auxiliary retaining layer in some embodiments according to the present disclosure. FIG. 31 is a plan view of a respective auxiliary retaining layer in some embodiments according to the present disclosure. Referring to FIG. 29 to FIG. 31, the respective retaining structure in some embodiments includes a respective auxiliary ring substantially surrounding the effective area of the electronic device.

Referring to FIG. 29, the respective auxiliary retaining layer in some embodiments includes a continuous ring substantially surrounding the effective area of the electronic device. The respective auxiliary retaining layer extends continuously around the effective area of the electronic device, forming a closed ring.

Referring to FIG. 30 and FIG. 31, the respective auxiliary retaining layer in some embodiments includes a discontinuous ring comprising a plurality of segments. The plurality of segments together substantially surround the effective area of the electronic device. In FIG. 30, at least two segments of the plurality of segments have a same length, for example, all segments of the plurality of segments have a same length. In FIG. 31, at least two segments of the plurality of segments have different lengths. Various alternative implementations may be practiced in the present disclosure.

When the respective auxiliary retaining layer is a continuous ring, an enhanced inter-layer adhesion (e.g., adhesion between adjacent auxiliary retaining layer) may be achieved. When the respective auxiliary retaining layer is a discontinuous ring, tensile stress between the respective auxiliary retaining layer and an adjacent insulating layer may be reduced.

The plurality of auxiliary retaining layers may be all continuous rings, may be all discontinuous rings, or may include at least one continuous ring and at least one discontinuous ring.

In the present disclosure, by having a retaining structure comprising a plurality of retaining layers, and by interconnecting adjacent retaining layers of the plurality of retaining layers, a total bonding area between adjacent retaining layers can be enhanced. The increased bonding area between adjacent retaining layers can effectively stabilize adhesion between adjacent conductive layers, against the relatively large thermal expansion of the insulating layers. Moreover, the ring structure of the retaining layers at least partially segregates the insulating layers into a plurality of regions, thereby reducing tensile stress of the insulating layers throughout the mother substrate. Stabilized adhesion and reduced tensile stress effectively prevent peeling defects in the electronic device. Moreover, the ring structure of the retaining layers can effectively prevent propagation of peeling defects from one region into adjacent regions of the mother substrate.

Figure 32:
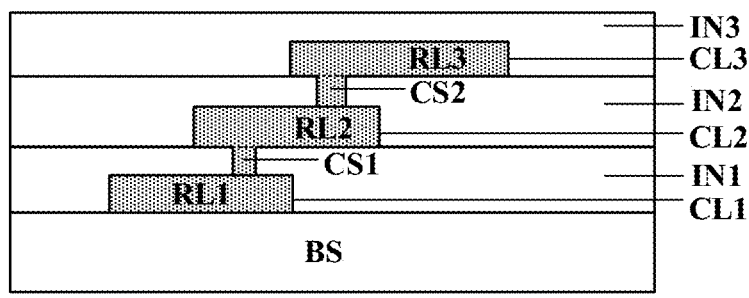
FIG. 32 is a cross-sectional view of a retaining structure in some embodiments according to the present disclosure.
Figure 33:
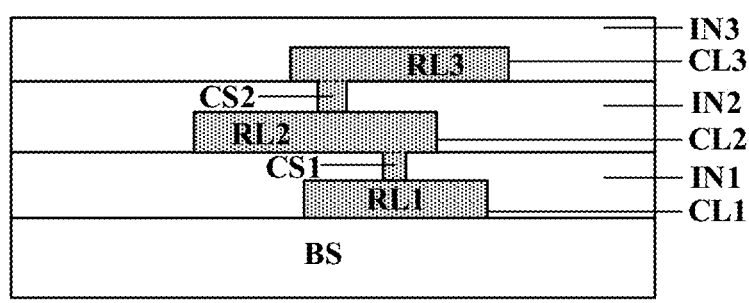
FIG. 33 is a cross-sectional view of a retaining structure in some embodiments according to the present disclosure.
Figure 34:
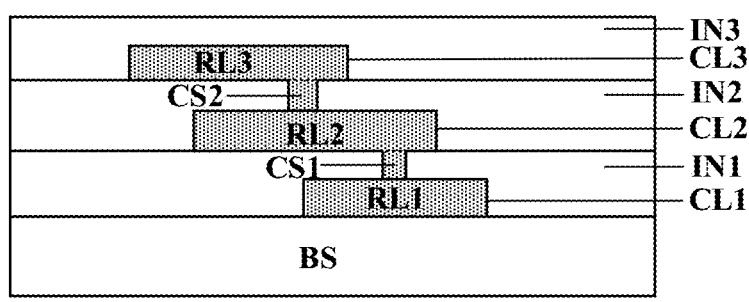
FIG. 34 is a cross-sectional view of a retaining structure in some embodiments according to the present disclosure.
Figure 35:
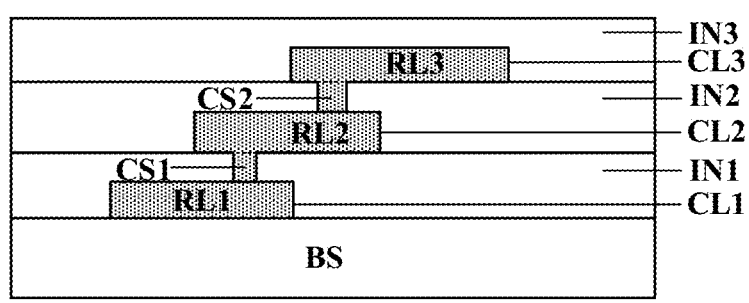
FIG. 35 is a cross-sectional view of a retaining structure in some embodiments according to the present disclosure.

FIG. 32 is a cross-sectional view of a retaining structure in some embodiments according to the present disclosure. FIG. 33 is a cross-sectional view of a retaining structure in some embodiments according to the present disclosure. FIG. 34 is a cross-sectional view of a retaining structure in some embodiments according to the present disclosure. FIG. 35 is a cross-sectional view of a retaining structure in some embodiments according to the present disclosure. Each of FIG. 32 to FIG. 35 may depict, for example, a cross-section along a C-C' line in FIG. 7. Referring to FIG. 32 to FIG. 35, a total number of the plurality of retaining layers may be three. The plurality of retaining layers in some embodiments include a first respective retaining layer RL1, a second respective retaining layer RL2, and a third respective retaining layer RL3. The first respective retaining layer RL1 and the second respective retaining layer RL2 are spaced apart by a first insulating layer IN1. The second respective retaining layer RL2 and the third respective retaining layer RL3 are spaced apart by a second insulating layer IN2. The retaining structure further includes a first connecting structure CS1 connecting the first respective retaining layer RL1 with the second respective retaining layer RL2. Optionally, the first respective retaining layer RL1 is in a same layer as the first conductive layer CL1 in the effective area of the electronic device. Optionally, the second respective retaining layer RL2 is in a same layer as the second conductive layer CL2 in the effective area of the electronic device. The retaining structure further includes a second connecting structure CS2 connecting the second respective retaining layer RL2 with the third respective retaining layer RL3. Optionally, the third respective retaining layer RL3 is in a same layer as the third conductive layer CL3 in the effective area of the electronic device. In one example, the second respective retaining layer RL2 and the first connecting structure CS1 are parts of a unitary structure. In another example, the third respective retaining layer RL3 and the second connecting structure CS2 are parts of a unitary structure.

In some embodiments, orthographic projections of at least two of the first respective retaining layer RL1, the second respective retaining layer RL2, and the third respective retaining layer RL3 on the base substrate BS at least partially overlap with each other, and are at least partially non-overlapping. Optionally, orthographic projections of any two of the first respective retaining layer RL1, the second respective retaining layer RL2, and the third respective retaining layer RL3 on the base substrate BS at least partially overlap with each other, and are at least partially non-overlapping. Optionally, orthographic projections of the first respective retaining layer RL1 and the second respective retaining layer RL2 on the base substrate BS at least partially overlap with each other, and are at least partially non-overlapping; orthographic projections of the second respective retaining layer RL2 and the third respective retaining layer RL3 on the base substrate BS at least partially overlap with each other, and are at least partially non-overlapping; and orthographic projections of the first respective retaining layer RL1 and the third respective retaining layer RL3 on the base substrate BS at least partially overlap with each other, and are at least partially non-overlapping.

In some embodiments, orthographic projections of the first connecting structure CS1 and the second connecting structure CS2 on the base substrate BS at least partially overlap with each other, and are at least partially non-overlapping.

The inventors of the present disclosure discover that, by having the unique structure as depicted in FIG. 32 to FIG. 35, the retaining layers are staggered with respect to each other, and the connecting structures are staggered with respect to each other. When the retaining structure is subject to tensile stress, the tensile stress or shearing stress are distributed at different positions of the retaining structure, rather than concentrated at a same position. The unique structure greatly enhances the stability of the retaining structure and the electronic device.

Figure 36:
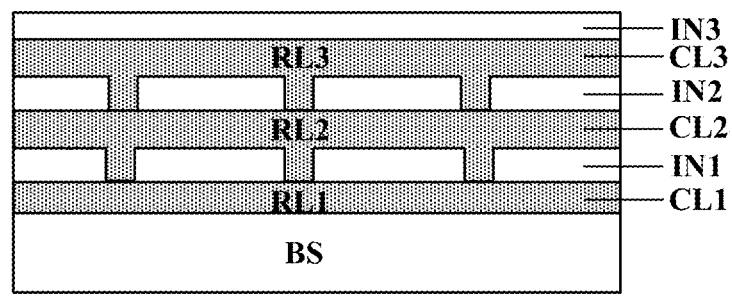
FIG. 36 is a cross-sectional view of a retaining structure in some embodiments according to the present disclosure.
Figure 37:
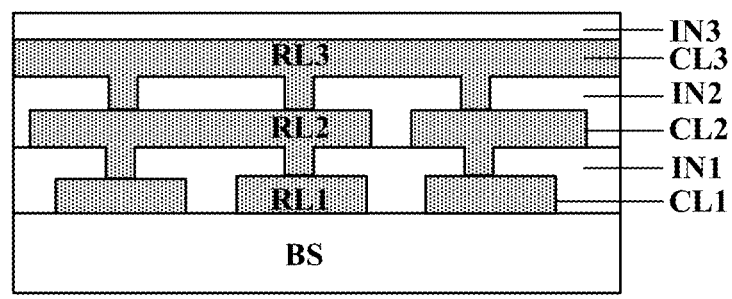
FIG. 37 is a cross-sectional view of a retaining structure in some embodiments according to the present disclosure.
Figure 38:
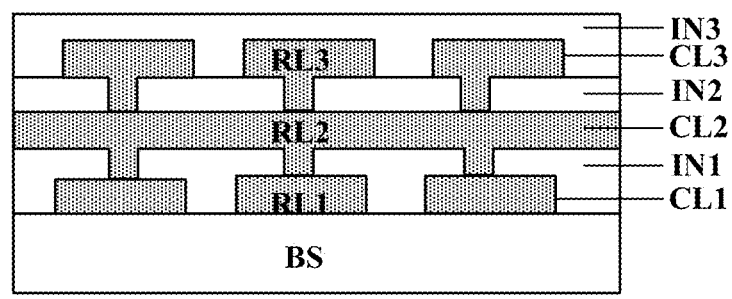
FIG. 38 is a cross-sectional view of a retaining structure in some embodiments according to the present disclosure.

FIG. 36 is a cross-sectional view of a retaining structure in some embodiments according to the present disclosure. FIG. 37 is a cross-sectional view of a retaining structure in some embodiments according to the present disclosure. FIG. 38 is a cross-sectional view of a retaining structure in some embodiments according to the present disclosure. Each of FIG. 36 to FIG. 38 may depict, for example, a cross-section along a line perpendicular to a C-C' line in FIG. 7. Referring to FIG. 9, the respective retaining layer in some embodiments includes a continuous ring substantially surrounding the effective area of the electronic device. Referring to FIG. 10 and FIG. 11, the respective retaining layer in some embodiments includes a discontinuous ring comprising a plurality of segments. Referring to FIG. 10, segments of the plurality of segments have a same length. Referring to FIG. 11, at least two segments of the plurality of segments have different lengths.

Referring to FIG. 36, in some embodiments, the plurality of retaining layers (the first respective retaining layer RL1, the second respective retaining layer RL2, and the third respective retaining layer RL3) are all continuous rings. Referring to FIG. 37, the third respective retaining layer RL3 is a continuous ring, and the first respective retaining layer RL1 and the second respective retaining layer RL2 are discontinuous rings. Segments of the first respective retaining layer RL1 have a same length. Segments of the second respective retaining layer RL2 have different lengths. Referring to FIG. 38, the second respective retaining layer RL2 is a continuous ring, and the first respective retaining layer RL1 and the third respective retaining layer RL3 are discontinuous rings. Segments of the first respective retaining layer RL1 have a same length. Segments of the third respective retaining layer RL3 have a same length.

Referring to FIG. 36, the first respective retaining layer RL1, the second respective retaining layer RL2, and the third respective retaining layer RL3 are all continuous rings. Due to the difference between expansion coefficients of the conductive material and the insulating material, a retaining layer having continuous ring would have a greater expansion under a same temperature change, based on the expansion equation $\Delta L = \alpha * L * T$, wherein $\Delta L$ stands for a degree of expansion, L stands for a length of the retaining layer, and T stands for a temperature.

Referring to FIG. 37 and FIG. 38, when discontinuous rings are employed, the degree of expansion can be decreased based on the above expansion equation. The retaining structure is less prone to peeling defect.

In another aspect, the present disclosure further provides a method of fabricating an electronic device. In some embodiments, the method includes forming electric components in an effective area; forming a retaining structure substantially surrounding a boundary of the effective area. Optionally, the method comprises forming multiple conductive layer and multiple insulating layers alternately stacked on a base substrate. Optionally, the retaining structure is configured to enhance adhesion between adjacent conductive layers in the electronic device. Optionally, forming the retaining structure comprises forming a plurality of retaining layers. Optionally, a respective retaining layer of the plurality of retaining layers is in direct contact with at least one insulating layer of the electronic device.

In some embodiments, the method further includes providing a mother substrate comprising a plurality of retaining structures and a plurality of effective areas, a respective retaining structure substantially surrounding a boundary of a respective effective area of the plurality of effective areas; and cutting the mother substrate along one or more cutting lines to produce the electronic device. Optionally, an individual cutting line of the one or more cutting lines is on a side of the respective retaining structure away from the boundary.

In some embodiments, the respective retaining layer is made of a same conductive material as a conductive material in a conductive layer of an electric component in the effective area.

In some embodiments, forming the respective retaining structure includes forming a respective ring substantially surrounding the effective area of the electronic device. Optionally, the respective ring is a continuous ring substantially surrounding the effective area of the electronic device. Optionally, the respective ring is a discontinuous ring substantially surrounding the effective area of the electronic device, the discontinuous ring comprising a plurality of segments.

In some embodiments, at least two adjacent retaining layers of the plurality of retaining layers are connected through a via in an insulating layer between the two adjacent retaining layers.

In some embodiments, forming the plurality of retaining layers includes forming a first respective retaining layer and forming a second respective retaining layer on a side of the first respective retaining layer away from a base substrate.

Optionally, forming the retaining structure further includes forming a first connecting structure connecting the first respective retaining layer with the second respective retaining layer. Optionally, the second respective retaining layer and the first connecting structure are parts of a first unitary structure. Optionally, the first respective retaining layer is formed in a same layer as a first conductive layer in the effective area of the electronic device. Optionally, the second respective retaining layer is formed in a same layer as a second conductive layer in the effective area of the electronic device.

In some embodiments, forming the plurality of retaining layers further includes forming a third respective retaining layer on a side of the second respective retaining layer away from the base substrate. Optionally, forming the retaining structure further includes forming a second connecting structure connecting the second respective retaining layer with the third respective retaining layer. Optionally, the third respective retaining layer and the second connecting structure are formed as parts of a second unitary structure. Optionally, the third respective retaining layer is formed in a same layer as a third conductive layer in the effective area of the electronic device.

In some embodiments, forming the plurality of retaining layers includes forming a first respective retaining layer, forming a second respective retaining layer on a side of the first respective retaining layer away from a base substrate, and forming a third respective retaining layer on a side of the second respective retaining layer away from the base substrate. Optionally, forming the retaining structure further includes forming a connecting structure connecting the third respective retaining layer with the second respective retaining layer. Optionally, the third respective retaining layer and the connecting structure are formed as parts of a unitary structure. Optionally, the first respective retaining layer is formed in a same layer as a first conductive layer in the effective area of the electronic device. Optionally, the second respective retaining layer is formed in a same layer as a second conductive layer in the effective area of the electronic device. Optionally, the third respective retaining layer is formed in a same layer as a third conductive layer in the effective area of the electronic device.

In some embodiments, forming the plurality of retaining layers includes forming a first respective retaining layer, forming a second respective retaining layer on a side of the first respective retaining layer away from a base substrate, and forming a third respective retaining layer on a side of the second respective retaining layer away from the base substrate. Optionally, forming the retaining structure further includes forming a connecting structure connecting the first respective retaining layer with the second respective retaining layer. Optionally, the second respective retaining layer and the connecting structure are formed as parts of a unitary structure. Optionally, the first respective retaining layer is formed in a same layer as a first conductive layer in the effective area of the electronic device. Optionally, the second respective retaining layer is formed in a same layer as a second conductive layer in the effective area of the electronic device. Optionally, the third respective retaining layer is formed in a same layer as a third conductive layer in the effective area of the electronic device.

In some embodiments, forming the plurality of retaining layers includes forming a first respective retaining layer and forming a second respective retaining layer on a side of the first respective retaining layer away from a base substrate. Optionally, forming the retaining structure further includes forming a connecting structure connecting the first respective retaining layer with the second respective retaining layer. Optionally, the second respective retaining layer and the connecting structure are formed as parts of a first unitary structure. Optionally, the first respective retaining layer is formed in a same layer as a first conductive layer in the effective area of the electronic device. Optionally, the second respective retaining layer is formed in a same layer as a third conductive layer in the effective area of the electronic device. Optionally, the method further includes forming a second conductive layer in the effective area, the second conductive layer formed on a side of the first conductive layer closer to the third conductive layer. Optionally, the method further includes forming a first insulating layer spacing apart the first conductive layer and the second conductive layer, and forming a second insulating layer spacing apart the second conductive layer and the third conductive layer. Optionally, the connecting structure extends through a via extending through the first insulating layer and the second insulating layer.

In some embodiments, the method further includes forming one or more auxiliary retaining layers. Optionally, a respective auxiliary retaining layer of the one or more auxiliary retaining layers is formed to be in direct contact with at least one retaining layer of the plurality of retaining layers.

In some embodiments, the respective auxiliary retaining layer is made of a material different from a material in the at least one retaining layer.

In some embodiments, the method includes forming a first respective auxiliary retaining layer; forming a first respective retaining layer on a side of the first respective auxiliary retaining layer away from a base substrate; forming a second respective auxiliary retaining layer on a side of the first respective retaining layer away from the base substrate; forming a second respective retaining layer on a side of the second respective auxiliary retaining layer away from the base substrate; and forming a first connecting structure connecting the first respective retaining layer with the second respective retaining layer. Optionally, the first connecting structure includes at least a portion of the second respective auxiliary retaining layer and a portion connected with the second respective retaining layer. Optionally, the second respective retaining layer and the portion of the first connecting structure connected with the second respective retaining layer are formed as parts of a unitary structure. Optionally, the first respective retaining layer is formed in a same layer as a first conductive layer in the effective area of the electronic device. Optionally, the second respective retaining layer is formed in a same layer as a second conductive layer in the effective area of the electronic device.

In some embodiments, the method further includes forming a third respective auxiliary retaining layer on a side of the second respective retaining layer away from the base substrate; forming a third respective retaining layer on a side of the third respective auxiliary retaining layer away from the base substrate; and forming a second connecting structure connecting the second respective retaining layer with the third respective retaining layer. Optionally, the second connecting structure includes at least a portion of the third respective auxiliary retaining layer and a portion connected with the third respective retaining layer. Optionally, the third respective retaining layer and the portion of the second connecting structure connected with the third respective retaining layer are formed as parts of a second unitary structure. Optionally, the third respective retaining layer is formed in a same layer as a third conductive layer in the effective area of the electronic device.

In some embodiments, the method includes forming a first respective auxiliary retaining layer; forming a first respective retaining layer on a side of the first respective auxiliary retaining layer away from a base substrate; forming a second respective retaining layer on a side of the first respective retaining layer away from the base substrate; forming a second respective auxiliary retaining layer on a side of the second respective retaining layer away from the base substrate; forming a third respective retaining layer on a side of the second respective auxiliary retaining layer away from the base substrate; and forming a connecting structure connecting the third respective retaining layer with the second respective retaining layer. Optionally, the connecting structure includes at least a portion of the second respective auxiliary retaining layer and a portion connected with the third respective retaining layer. Optionally, the third respective retaining layer and the portion of the connecting structure connected with the third respective retaining layer are formed as parts of a unitary structure. Optionally, the first respective retaining layer is formed in a same layer as a first conductive layer in the effective area of the electronic device. Optionally, the second respective retaining layer is formed in a same layer as a second conductive layer in the effective area of the electronic device. Optionally, the third respective retaining layer is formed in a same layer as a third conductive layer in the effective area of the electronic device.

In some embodiments, the method includes forming a first respective auxiliary retaining layer; forming a first respective retaining layer on a side of the first respective auxiliary retaining layer away from a base substrate; forming a second respective auxiliary retaining layer on a side of the first respective retaining layer away from the base substrate; forming a second respective retaining layer on a side of the second respective auxiliary retaining layer away from the base substrate; forming a third respective retaining layer on a side of the second respective retaining layer away from the base substrate; and forming a connecting structure connecting the first respective retaining layer with the second respective retaining layer. Optionally, the connecting structure includes at least a portion of the second respective auxiliary retaining layer and a portion connected with the second respective retaining layer. Optionally, the second respective retaining layer and the portion of the connecting structure connected with the second respective retaining layer are formed as parts of a unitary structure. Optionally, the first respective retaining layer is formed in a same layer as a first conductive layer in the effective area of the electronic device. Optionally, the second respective retaining layer is formed in a same layer as a second conductive layer in the effective area of the electronic device. Optionally, the third respective retaining layer is formed in a same layer as a third conductive layer in the effective area of the electronic device.

In some embodiments, the method includes forming a first respective auxiliary retaining layer; forming a first respective retaining layer on a side of the first respective auxiliary retaining layer away from a base substrate; forming a second respective auxiliary retaining layer on a side of the first respective retaining layer away from the base substrate; forming a second respective retaining layer on a side of the second respective auxiliary retaining layer away from the base substrate; and forming a connecting structure connecting the first respective retaining layer with the second respective retaining layer. Optionally, the connecting structure includes at least a portion of the second respective auxiliary retaining layer and a portion connected with the second respective retaining layer. Optionally, the second respective retaining layer and the portion of the connecting structure connected with the second respective retaining layer are formed as parts of a unitary structure. Optionally, the first respective retaining layer is formed in a same layer as a first conductive layer in the effective area of the electronic device. Optionally, the second respective retaining layer is formed in a same layer as a third conductive layer in the effective area of the electronic device. Optionally, the method further includes forming a second conductive layer in the effective area, the second conductive layer formed on a side of the first conductive layer closer to the third conductive layer. Optionally, the method further includes forming a first insulating layer spacing apart the first conductive layer and the second conductive layer, and forming a second insulating layer spacing apart the second conductive layer and the third conductive layer. Optionally, the connecting structure extends through a via extending through the first insulating layer and the second insulating layer.

Figure 39A:
FIG. 39A to FIG. 39O illustrate a process of fabricating an electronic device in some embodiments according to the present disclosure.
Figure 39B:
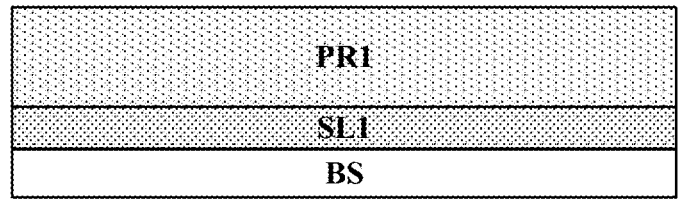
Figure 39C:
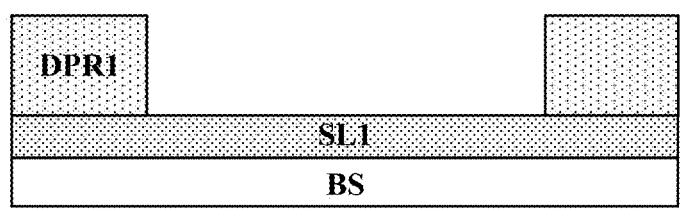
Figure 39D:
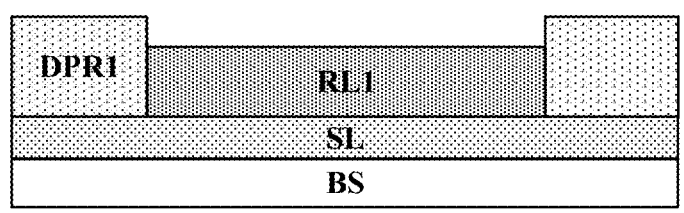
Figure 39E:
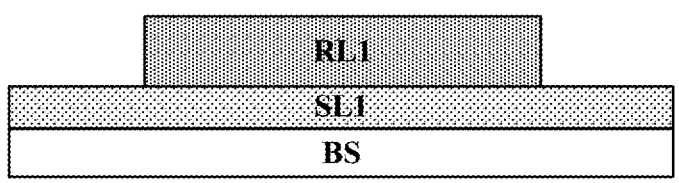
Figure 39F:
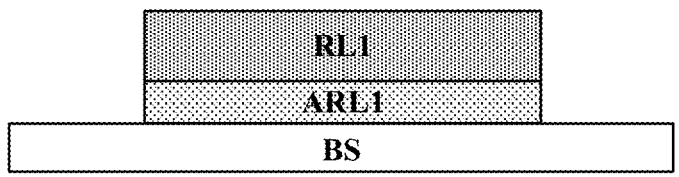
Figure 39G:
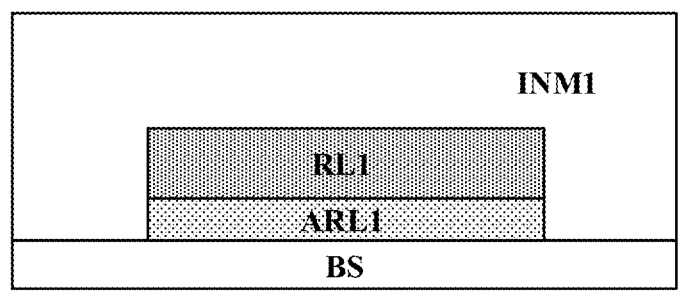
Figure 39H:
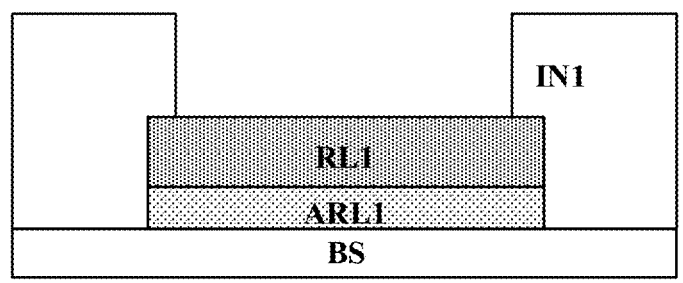
Figure 39I:
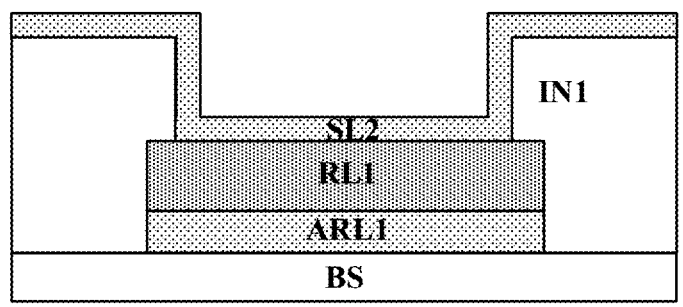
Figure 39J:
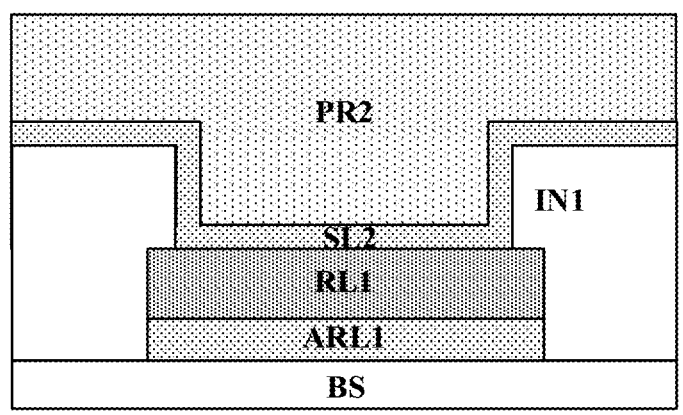
Figure 39K:
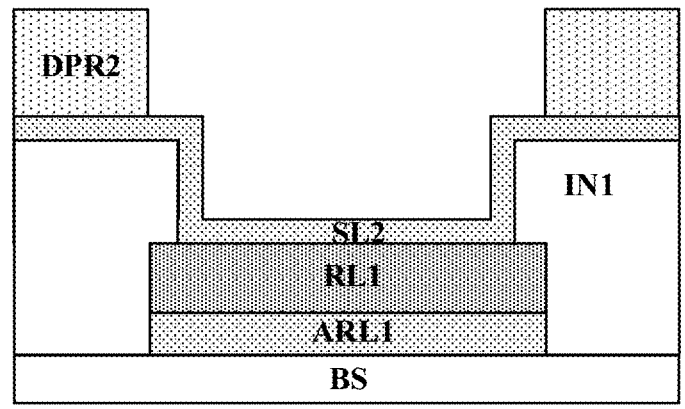
Figure 39L:
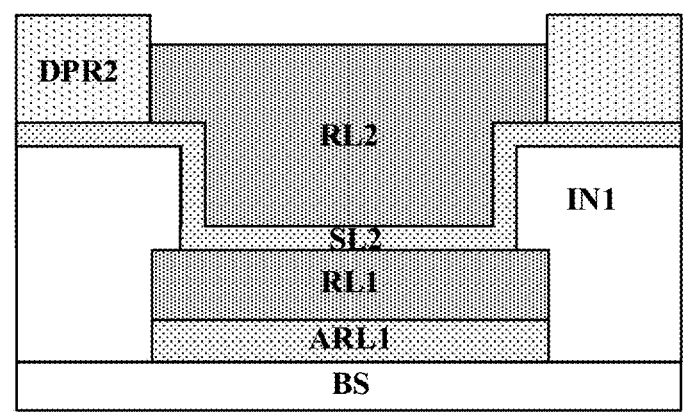
Figure 39M:
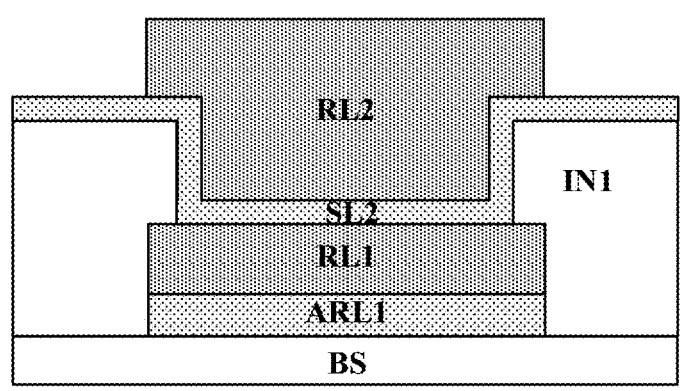
Figure 39N:
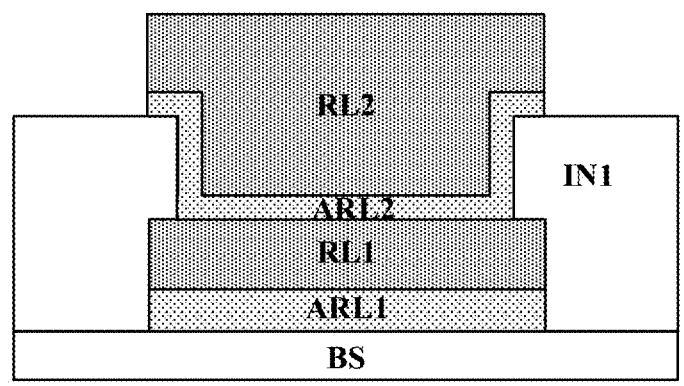
Figure 39O:
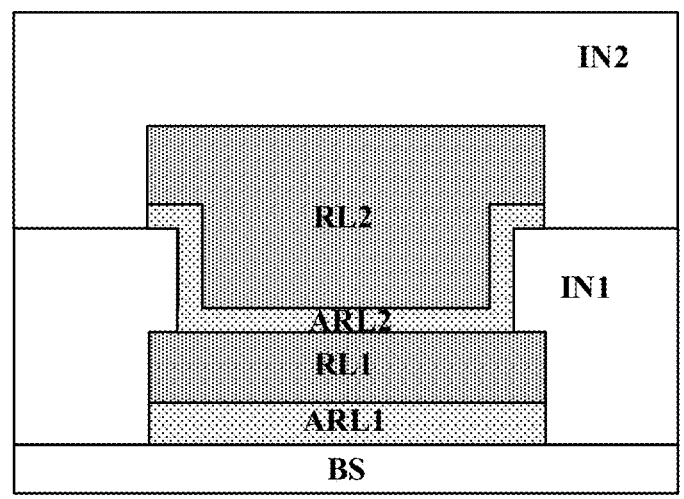

FIG. 39A to FIG. 39O illustrate a process of fabricating an electronic device in some embodiments according to the present disclosure. FIG. 39A to FIG. 39O illustrate an embodiment in which an additive plating process is used. Referring to FIG. 39A, a first seed layer SL1 is formed on a base substrate BS. Various appropriate methods may be used for forming the first seed layer SL1. Examples of appropriate methods for forming the first seed layer SL1 include sputtering. Various appropriate materials may be used for forming the first seed layer SL1. Examples of appropriate materials include a metallic material such as a titanium/copper laminate.

Referring to FIG. 39B, a first photoresist layer PR1 is formed on a side of the first seed layer SL1 away from the base substrate BS. Various appropriate photoresist materials may be used for making the first photoresist layer PR1. Examples of appropriate photoresist materials for making the first photoresist layer PR1 include a positive photoresist material and a negative photoresist material. A thickness of the first photoresist layer PR1 is greater than a thickness of a first respective retaining layer.

Referring to FIG. 39B and FIG. 39C, the first photoresist layer PR1 is exposed and developed, thereby forming a first developed photoresist layer DPR1. The photoresist material in a region where the first respective retaining layer is to be formed is removed.

Referring to FIG. 39D, a first respective retaining layer RL1 is formed in a region where the photoresist material was removed in FIG. 39C. A thickness of the first respective retaining layer RL1 is less than a thickness of the first developed photoresist layer DPR1. Various appropriate methods may be used for forming the first respective retaining layer RL1. Examples of appropriate methods for forming the first respective retaining layer RL1 include electroplating and chemical vapor deposition. Various appropriate materials may be used for forming the first respective retaining layer RL1. Examples of appropriate materials for forming the first respective retaining layer RL1 include a metallic material such as copper.

Referring to FIG. 39D and FIG. 39E, the first developed photoresist layer DPR1 is removed.

Referring to FIG. 39F, subsequent to removing the first developed photoresist layer DPR1, the first seed layer SL1 is patterned (e.g., etched using a mask plate) to form a first respective auxiliary retaining layer ARL1. Referring to FIG.

39D to FIG. 39F, a portion of the first seed layer SL1 corresponding to the first developed photoresist layer DPR1 is removed.

Referring to FIG. 39G, a first insulating material layer INM1 is formed on a side of the first respective retaining layer RL1 away from the base substrate BS. Various appropriate materials may be used for forming the first insulating material layer INM1. Examples of appropriate materials for forming the first insulating material layer INM1 include polyimide.

Referring to FIG. 39G and FIG. 39H, the first insulating material layer INM1 is patterned (e.g., etched) to form a first insulating layer IN1. A portion of a surface of the first respective retaining layer RL1 is uncovered subsequent to patterning the first insulating material layer INM1.

Referring to FIG. 39I, a second seed layer SL2 is formed on a side of the first respective retaining layer RL1 away from the base substrate BS. The second seed layer SL2 covers the portion of the surface of the first respective retaining layer RL1 uncovered subsequent to patterning the first insulating material layer INM1. Various appropriate methods may be used for forming the second seed layer SL2. Examples of appropriate methods for forming the second seed layer SL2 include sputtering. Various appropriate materials may be used for forming the second seed layer SL2. Examples of appropriate materials for making the second seed layer SL2 include a metallic material such as a titanium/copper laminate.

Referring to FIG. 39J, a second photoresist layer PR2 is formed on a side of the second seed layer SL2 away from the base substrate BS. Various appropriate photoresist materials may be used for making the second photoresist layer PR2. Examples of appropriate photoresist materials for making the second photoresist layer PR2 include a positive photoresist material and a negative photoresist material.

Referring to FIG. 39J and FIG. 39K, the second photoresist layer PR2 is exposed and developed, thereby forming a second developed photoresist layer DPR2. The photoresist material in a region where the second respective retaining layer is to be formed is removed.

Referring to FIG. 39L, a second respective retaining layer RL2 is formed in a region where the photoresist material of the second photoresist layer was removed in FIG. 39K. The second respective retaining layer RL2 is formed on a side of the second seed layer SL2 away from the base substrate BS. Various appropriate methods may be used for forming the second respective retaining layer RL2. Examples of appropriate methods for forming the second respective retaining layer RL2 include electroplating and chemical vapor deposition. Various appropriate materials may be used for forming the second respective retaining layer RL2. Examples of appropriate materials for forming the second respective retaining layer RL2 include a metallic material such as copper.

Referring to FIG. 39L and FIG. 39M, the second developed photoresist layer DPR2 is removed.

Referring to FIG. 39N, subsequent to removing the second developed photoresist layer DPR2, the second seed layer SL2 is patterned (e.g., etched using a mask plate) to form a second respective auxiliary retaining layer ARL2. Referring to FIG. 39L to FIG. 39N, a portion of the second seed layer SL2 corresponding to the second developed photoresist layer DPR2 is removed.

Referring to FIG. 39O, a second insulating layer IN2 is formed on a side of the second respective retaining layer RL2 away from the base substrate BS.

Figure 40A:
FIG. 40A to FIG. 40O illustrate a process of fabricating an electronic device in some embodiments according to the present disclosure.
Figure 40B:
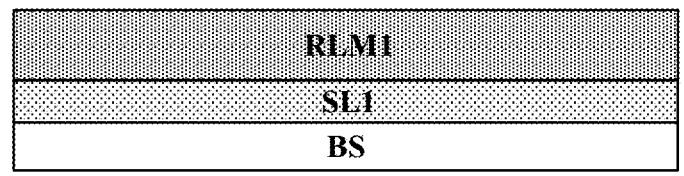
Figure 40C:
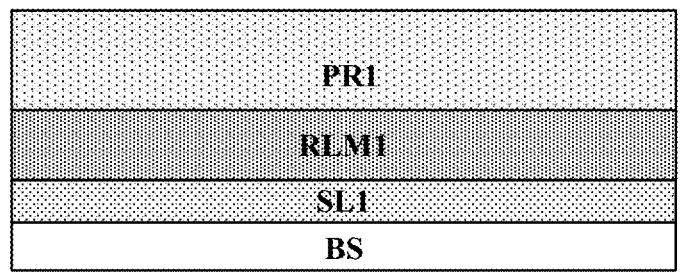
Figure 40D:
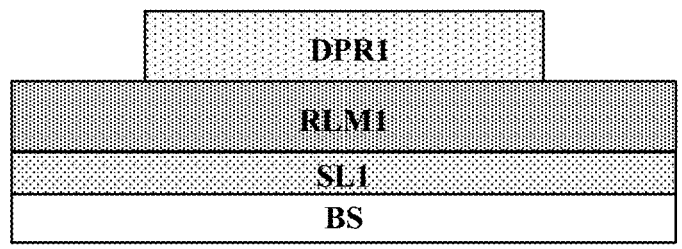
Figure 40E:
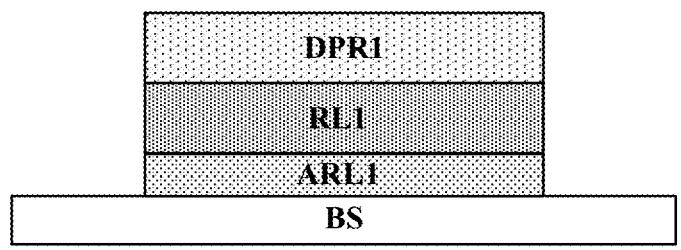
Figure 40F:
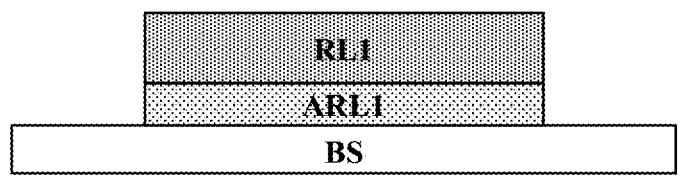
Figure 40G:
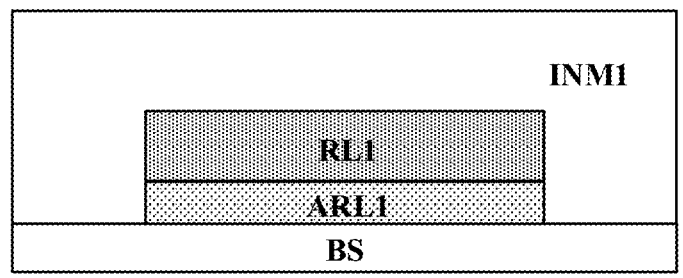
Figure 40H:
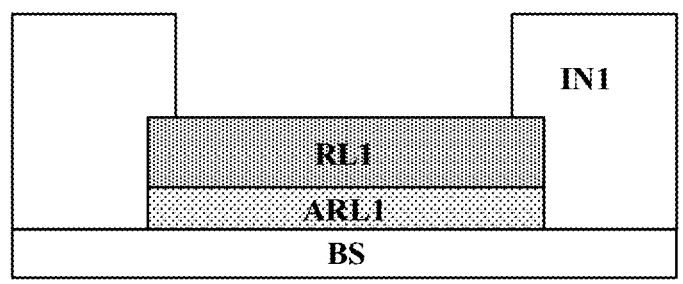
Figure 40I:
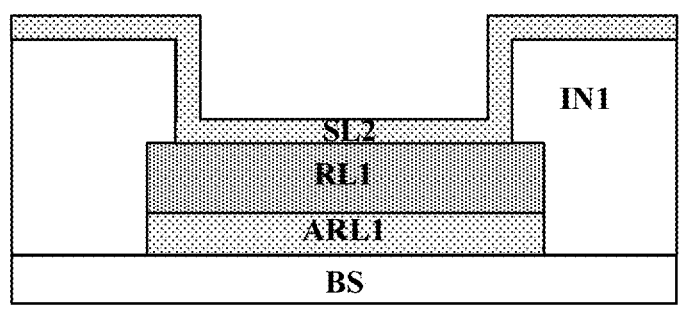
Figure 40J:
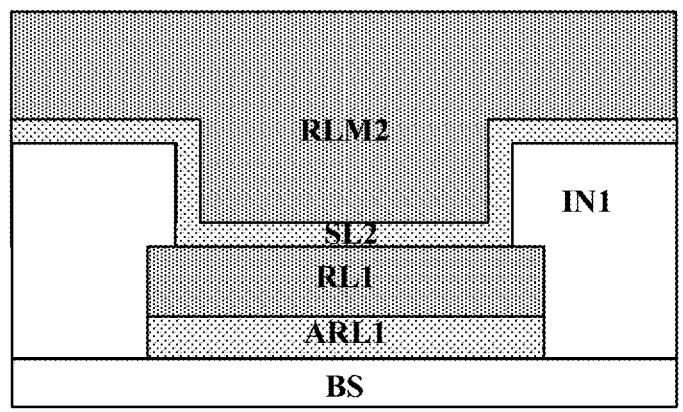
Figure 40K:
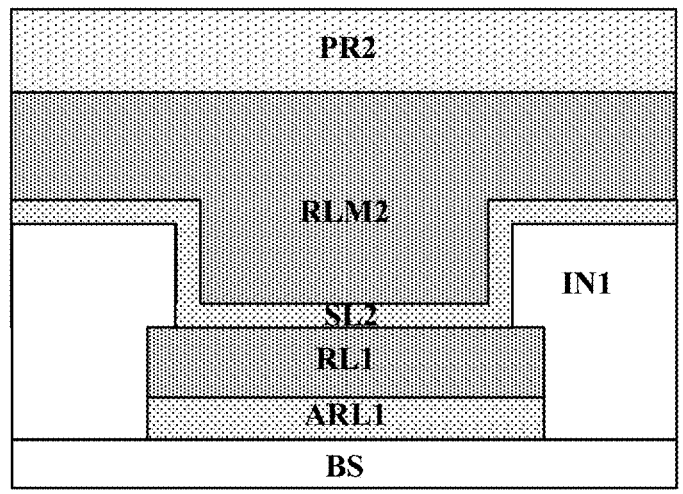
Figure 40L:
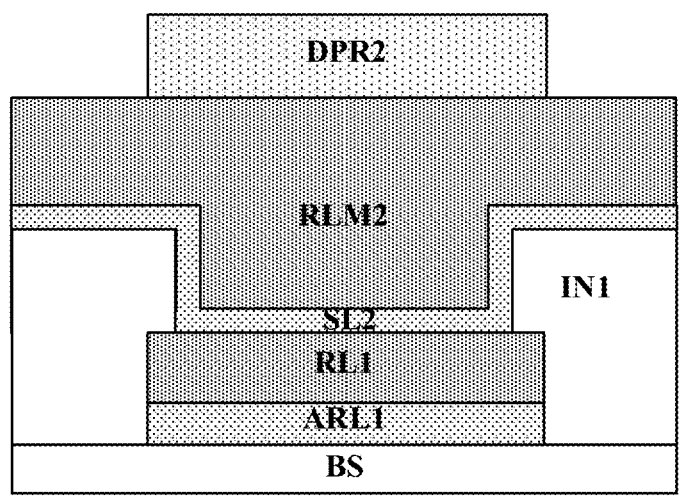
Figure 40M:
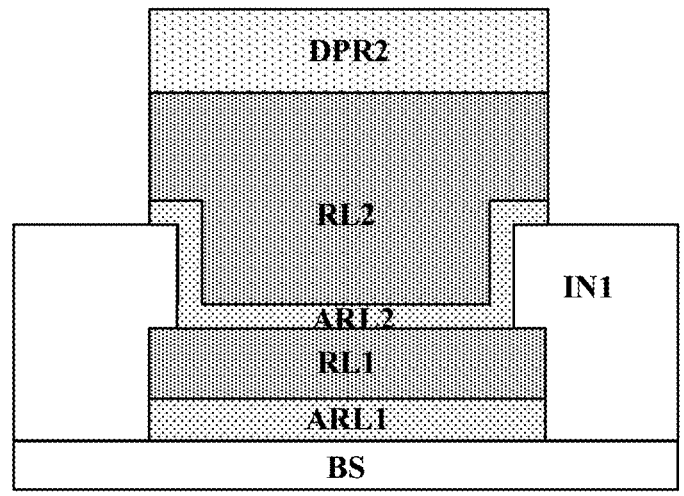
Figure 40N:
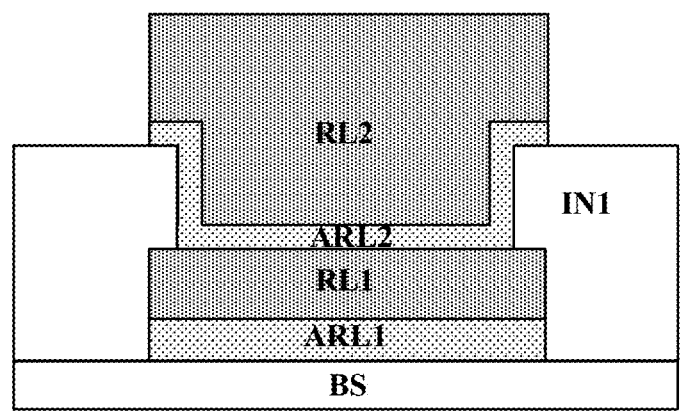
Figure 40O:
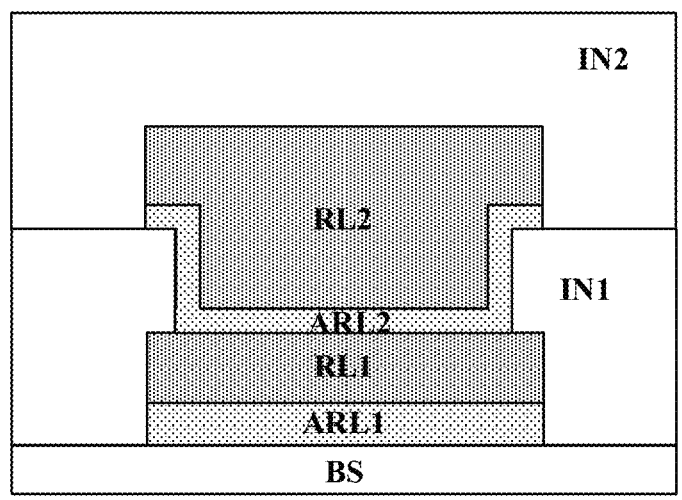

FIG. 40A to FIG. 40O illustrate a process of fabricating an electronic device in some embodiments according to the present disclosure. FIG. 40A to FIG. 40O illustrate an embodiment in which a subtractive plating process is used. Referring to FIG. 40A, a first seed layer SL1 is formed on a base substrate BS. Various appropriate methods may be used for forming the first seed layer SL1. Examples of appropriate methods for forming the first seed layer SL1 include sputtering. Various appropriate materials may be used for forming the first seed layer SL1. Examples of appropriate materials include a metallic material such as a titanium/copper laminate.

Referring to FIG. 40B, a first respective retaining material layer RLM1 is formed on a side of the first seed layer SL1 away from the base substrate BS. Various appropriate methods may be used for forming the first respective retaining material layer RLM1. Examples of appropriate methods for forming the first respective retaining material layer RLM1 include electroplating and chemical vapor deposition. Various appropriate materials may be used for forming the first respective retaining material layer RLM1. Examples of appropriate materials for forming the first respective retaining material layer RLM1 include a metallic material such as copper.

Referring to FIG. 40C, a first photoresist layer PR1 is formed on a side of the first respective retaining material layer RLM1 away from the base substrate BS. Various appropriate photoresist materials may be used for making the first photoresist layer PR1. Examples of appropriate photoresist materials for making the first photoresist layer PR1 include a positive photoresist material and a negative photoresist material.

Referring to FIG. 40D, the first photoresist layer PR1 is exposed and developed, thereby forming a first developed photoresist layer DPR1. The photoresist material outside a region where the first respective retaining layer is to be formed is removed.

Referring to FIG. 40E, subsequent to forming the first developed photoresist layer DPR1, the first seed layer SL1 and the first respective retaining material layer RLM1 are patterned (e.g., etched using the first developed photoresist layer DPR1 as a mask plate) to form a first respective auxiliary retaining layer ARL1 and a first respective retaining layer RL1.

Referring to FIG. 40E and FIG. 40F, the first developed photoresist layer DPR1 is removed.

Referring to FIG. 40G, a first insulating material layer INM1 is formed on a side of the first respective retaining layer RL1 away from the base substrate BS. Various appropriate materials may be used for forming the first insulating material layer INM1. Examples of appropriate materials for forming the first insulating material layer INM1 include polyimide.

Referring to FIG. 40G and FIG. 40H, the first insulating material layer INM1 is patterned (e.g., etched) to form a first insulating layer IN1. A portion of a surface of the first respective retaining layer RL1 is uncovered subsequent to patterning the first insulating material layer INM1.

Referring to FIG. 40I, a second seed layer SL2 is formed on a side of the first respective retaining layer RL1 away from the base substrate BS. The second seed layer SL2 covers the portion of the surface of the first respective retaining layer RL1 uncovered subsequent to patterning the first insulating material layer INM1. Various appropriate methods may be used for forming the second seed layer SL2. Examples of appropriate methods for forming the second seed layer SL2 include sputtering. Various appropriate materials may be used for forming the second seed layer SL2. Examples of appropriate materials for making the second seed layer SL2 include a metallic material such as a titanium/copper laminate.

Referring to FIG. 40J, a second respective retaining material layer RLM2 is formed on a side of the second seed layer SL2 away from the base substrate BS. Various appropriate methods may be used for forming the second respective retaining material layer RLM2. Examples of appropriate methods for forming the second respective retaining material layer RLM2 include electroplating and chemical vapor deposition. Various appropriate materials may be used for forming the second respective retaining material layer RLM2. Examples of appropriate materials for forming the second respective retaining material layer RLM2 include a metallic material such as copper.

Referring to FIG. 40K, a second photoresist layer PR2 is formed on a side of the second respective retaining material layer RLM2 away from the base substrate BS. Various appropriate photoresist materials may be used for making the second photoresist layer PR2. Examples of appropriate photoresist materials for making the second photoresist layer PR2 include a positive photoresist material and a negative photoresist material.

Referring to FIG. 40K and FIG. 40L, the second photoresist layer PR2 is exposed and developed, thereby forming a second developed photoresist layer DPR2. The photoresist material outside a region where the second respective retaining layer is to be formed is removed.

Referring to FIG. 40M, subsequent to forming the second developed photoresist layer DPR2, the second seed layer SL2 and the second respective retaining material layer RLM2 are patterned (e.g., etched using the second developed photoresist layer DPR2 as a mask plate) to form a second respective auxiliary retaining layer ARL2 and a second respective retaining layer RL2.

Referring to FIG. 40M and FIG. 40N, the second developed photoresist layer DPR2 is removed.

Referring to FIG. 40O, a second insulating layer IN2 is formed on a side of the second respective retaining layer RL2 away from the base substrate BS. Various appropriate materials may be used for forming the second insulating layer IN2. Examples of appropriate materials for forming the second insulating layer IN2 include polyimide.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An electronic device, comprising:
   electric components in an effective area; and
   a retaining structure substantially surrounding a boundary of the effective area;
   wherein the electronic device comprises a base substrate, and multiple conductive layer and multiple insulating layers alternately stacked on the base substrate;
   the retaining structure is configured to enhance adhesion between conductive layers adjacent to each other in the electronic device;
   the retaining structure comprises one or more retaining layers; and
   a respective retaining layer of the one or more retaining layers is in direct contact with at least one insulating layer of the electronic device;
   wherein the respective retaining structure comprises a respective ring substantially surrounding the effective area of the electronic device; and
   the respective ring is a discontinuous ring substantially surrounding the effective area of the electronic device, the discontinuous ring comprising a plurality of segments.

2. The electronic device of claim 1, wherein the retaining structure is between the boundary of the effective area and an edge of the electronic device.

3. The electronic device of claim 1, wherein at least two adjacent retaining layers of the one or more retaining layers are connected through a via in an insulating layer between the two adjacent retaining layers.

4. The electronic device of claim 1, wherein the one or more retaining layers comprises a first respective retaining layer and a second respective retaining layer on a side of the first respective retaining layer away from a base substrate;
   wherein the retaining structure further comprises a first connecting structure connecting the first respective retaining layer with the second respective retaining layer;
   the second respective retaining layer and the first connecting structure are parts of a first unitary structure;
   the first respective retaining layer is in a same layer as a first conductive layer in the effective area of the electronic device; and
   the second respective retaining layer is in a same layer as a second conductive layer in the effective area of the electronic device.

5. The electronic device of claim 4, wherein the one or more retaining layers further comprises a third respective retaining layer on a side of the second respective retaining layer away from the base substrate;
   wherein the retaining structure further comprises a second connecting structure connecting the second respective retaining layer with the third respective retaining layer;

the third respective retaining layer and the second connecting structure are parts of a second unitary structure; and the third respective retaining layer is in a same layer as a third conductive layer in the effective area of the electronic device.

6. The electronic device of claim 1, wherein the one or more retaining layers comprises a first respective retaining layer, a second respective retaining layer on a side of the first respective retaining layer away from a base substrate, and a third respective retaining layer on a side of the second respective retaining layer away from the base substrate;
wherein the retaining structure further comprises a connecting structure connecting the third respective retaining layer with the second respective retaining layer;
the third respective retaining layer and the connecting structure are parts of a unitary structure;
the first respective retaining layer is in a same layer as a first conductive layer in the effective area of the electronic device;
the second respective retaining layer is in a same layer as a second conductive layer in the effective area of the electronic device; and
the third respective retaining layer is in a same layer as a third conductive layer in the effective area of the electronic device.

7. The electronic device of claim 1, wherein the one or more retaining layers comprises a first respective retaining layer, a second respective retaining layer on a side of the first respective retaining layer away from a base substrate, and a third respective retaining layer on a side of the second respective retaining layer away from the base substrate;
wherein the retaining structure further comprises a connecting structure connecting the first respective retaining layer with the second respective retaining layer;
the second respective retaining layer and the connecting structure are parts of a unitary structure;
the first respective retaining layer is in a same layer as a first conductive layer in the effective area of the electronic device;
the second respective retaining layer is in a same layer as a second conductive layer in the effective area of the electronic device; and
the third respective retaining layer is in a same layer as a third conductive layer in the effective area of the electronic device.

8. The electronic device of claim 1, wherein the one or more retaining layers comprises a first respective retaining layer and a second respective retaining layer on a side of the first respective retaining layer away from a base substrate;
wherein the retaining structure further comprises a connecting structure connecting the first respective retaining layer with the second respective retaining layer;
the second respective retaining layer and the connecting structure are parts of a first unitary structure;
the first respective retaining layer is in a same layer as a first conductive layer in the effective area of the electronic device; and
the second respective retaining layer is in a same layer as a third conductive layer in the effective area of the electronic device;
wherein the electronic device further comprises a second conductive layer in the effective area, the second conductive layer on a side of the first conductive layer closer to the third conductive layer;
the electronic device further comprises a first insulating layer spacing apart the first conductive layer and the second conductive layer, and a second insulating layer spacing apart the second conductive layer and the third conductive layer; and
the connecting structure extends through a via extending through the first insulating layer and the second insulating layer.

9. The electronic device of claim 1, further comprising one or more auxiliary retaining layers;
wherein a respective auxiliary retaining layer of the one or more auxiliary retaining layers is in direct contact with at least one retaining layer of the one or more retaining layers.

10. The electronic device of claim 9, wherein the respective auxiliary retaining layer comprises a material different from a material in the at least one retaining layer.

11. The electronic device of claim 9, comprising:
a first respective auxiliary retaining layer;
a first respective retaining layer on a side of the first respective auxiliary retaining layer away from a base substrate;
a second respective auxiliary retaining layer on a side of the first respective retaining layer away from the base substrate;
a second respective retaining layer on a side of the second respective auxiliary retaining layer away from the base substrate; and
a first connecting structure connecting the first respective retaining layer with the second respective retaining layer;
wherein the first connecting structure comprises at least a portion of the second respective auxiliary retaining layer and a portion connected with the second respective retaining layer;
the second respective retaining layer and the portion of the first connecting structure connected with the second respective retaining layer are parts of a unitary structure;
the first respective retaining layer is in a same layer as a first conductive layer in the effective area of the electronic device; and
the second respective retaining layer is in a same layer as a second conductive layer in the effective area of the electronic device.

12. The electronic device of claim 11, further comprising:
a third respective auxiliary retaining layer on a side of the second respective retaining layer away from the base substrate;
a third respective retaining layer on a side of the third respective auxiliary retaining layer away from the base substrate; and
a second connecting structure connecting the second respective retaining layer with the third respective retaining layer;
wherein the second connecting structure comprises at least a portion of the third respective auxiliary retaining layer and a portion connected with the third respective retaining layer;
the third respective retaining layer and the portion of the second connecting structure connected with the third respective retaining layer are parts of a second unitary structure; and
the third respective retaining layer is in a same layer as a third conductive layer in the effective area of the electronic device.

13. The electronic device of claim 9, comprising:
a first respective auxiliary retaining layer;

a first respective retaining layer on a side of the first respective auxiliary retaining layer away from a base substrate;
a second respective retaining layer on a side of the first respective retaining layer away from the base substrate;
a second respective auxiliary retaining layer on a side of the second respective retaining layer away from the base substrate;
a third respective retaining layer on a side of the second respective auxiliary retaining layer away from the base substrate; and
a connecting structure connecting the third respective retaining layer with the second respective retaining layer;
wherein the connecting structure comprises at least a portion of the second respective auxiliary retaining layer and a portion connected with the third respective retaining layer;
the third respective retaining layer and the portion of the connecting structure connected with the third respective retaining layer are parts of a unitary structure;
the first respective retaining layer is in a same layer as a first conductive layer in the effective area of the electronic device;
the second respective retaining layer is in a same layer as a second conductive layer in the effective area of the electronic device; and
the third respective retaining layer is in a same layer as a third conductive layer in the effective area of the electronic device.

14. The electronic device of claim 9, comprising:
a first respective auxiliary retaining layer;
a first respective retaining layer on a side of the first respective auxiliary retaining layer away from a base substrate;
a second respective auxiliary retaining layer on a side of the first respective retaining layer away from the base substrate;
a second respective retaining layer on a side of the second respective auxiliary retaining layer away from the base substrate;
a third respective retaining layer on a side of the second respective retaining layer away from the base substrate; and
a connecting structure connecting the first respective retaining layer with the second respective retaining layer;
wherein the connecting structure includes at least a portion of the second respective auxiliary retaining layer and a portion connected with the second respective retaining layer;
the second respective retaining layer and the portion of the connecting structure connected with the second respective retaining layer are parts of a unitary structure;
the first respective retaining layer is in a same layer as a first conductive layer in the effective area of the electronic device;
the second respective retaining layer is in a same layer as a second conductive layer in the effective area of the electronic device; and
the third respective retaining layer is in a same layer as a third conductive layer in the effective area of the electronic device.

15. The electronic device of claim 9, comprising:
a first respective auxiliary retaining layer;
a first respective retaining layer on a side of the first respective auxiliary retaining layer away from a base substrate;
a second respective auxiliary retaining layer on a side of the first respective retaining layer away from the base substrate;
a second respective retaining layer on a side of the second respective auxiliary retaining layer away from the base substrate; and
a connecting structure connecting the first respective retaining layer with the second respective retaining layer;
wherein the connecting structure comprises at least a portion of the second respective auxiliary retaining layer and a portion connected with the second respective retaining layer;
the second respective retaining layer and the portion of the connecting structure connected with the second respective retaining layer are parts of a unitary structure;
the first respective retaining layer is in a same layer as a first conductive layer in the effective area of the electronic device; and
the second respective retaining layer is in a same layer as a third conductive layer in the effective area of the electronic device;
wherein the electronic device further comprises a second conductive layer in the effective area, the second conductive layer on a side of the first conductive layer closer to the third conductive layer;
the electronic device further comprises a first insulating layer spacing apart the first conductive layer and the second conductive layer, and a second insulating layer spacing apart the second conductive layer and the third conductive layer; and
the connecting structure extends through a via extending through the first insulating layer and the second insulating layer.

16. A method of fabricating an electronic device, comprising:
forming electric components in an effective area; and
forming a retaining structure substantially surrounding a boundary of the effective area;
wherein the method comprises forming multiple conductive layer and multiple insulating layers alternately stacked on a base substrate;
the retaining structure is configured to enhance adhesion between conductive layers adjacent to each other in the electronic device;
forming the retaining structure comprises forming one or more retaining layers; and
a respective retaining layer of the one or more retaining layers is in direct contact with at least one insulating layer of the electronic device;
wherein the respective retaining structure comprises a respective ring substantially surrounding the effective area of the electronic device; and
the respective ring is a discontinuous ring substantially surrounding the effective area of the electronic device, the discontinuous ring comprising a plurality of segments.

17. The method of claim 16, further comprising:
providing a mother substrate comprising a plurality of retaining structures and a plurality of effective areas, a respective retaining structure substantially surrounding a boundary of a respective effective area of the plurality of effective areas; and cutting the mother substrate along one or more cutting lines to produce the electronic device;

wherein an individual cutting line of the one or more cutting lines is on a side of the respective retaining structure away from the boundary.

* * * * *